(12) United States Patent
Miyasaka

(10) Patent No.: US 7,274,070 B2
(45) Date of Patent: Sep. 25, 2007

(54) COMPLEMENTARY THIN FILM TRANSISTOR CIRCUIT, ELECTRO-OPTICAL DEVICE, AND ELECTRONIC APPARATUS

(75) Inventor: Mitsutoshi Miyasaka, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 88 days.

(21) Appl. No.: 10/786,151

(22) Filed: Feb. 26, 2004

(65) Prior Publication Data

US 2004/0178452 A1  Sep. 16, 2004

(30) Foreign Application Priority Data

Feb. 28, 2003  (JP)  ............................... 2003-053998

(51) Int. Cl.
*H01L 27/12* (2006.01)
(52) U.S. Cl. ...................... 257/350; 257/351; 257/291; 257/E27.112; 438/153; 438/154
(58) Field of Classification Search ................ 257/274, 257/338, 347, 350, 353, 354, 369
See application file for complete search history.

(56) References Cited

U.S. PATENT DOCUMENTS

| | | | |
|---|---|---|---|
| 5,821,559 A * | 10/1998 | Yamazaki et al. ............. | 257/57 |
| 5,824,574 A | 10/1998 | Yamazaki et al. | |
| 5,858,823 A * | 1/1999 | Yamazaki et al. .......... | 438/166 |
| 6,255,146 B1 * | 7/2001 | Shimizu et al. ............. | 438/162 |
| 6,617,644 B1 * | 9/2003 | Yamazaki et al. .......... | 257/347 |
| 6,667,188 B2 * | 12/2003 | Tanabe ........................ | 438/48 |
| 2002/0117736 A1 * | 8/2002 | Yamazaki et al. .......... | 257/627 |
| 2003/0052337 A1 * | 3/2003 | Tanabe ....................... | 257/200 |
| 2003/0092213 A1 * | 5/2003 | Yamazaki et al. ............ | 438/48 |
| 2003/0132439 A1 * | 7/2003 | Kimura et al. ................ | 257/72 |

(Continued)

FOREIGN PATENT DOCUMENTS

JP  A-01-264215  10/1989

(Continued)

OTHER PUBLICATIONS

"TBD: Single Crystal Thin Film Transistors" Webpage. *IBM Technical Disclosure Bulletin* Aug. 1993, pp. 257-258 http://www.delphion.com/tdbs/tbd?&order=93A+61960.

(Continued)

*Primary Examiner*—Jerome Jackson
*Assistant Examiner*—Paul Budd
(74) *Attorney, Agent, or Firm*—Oliff & Berridge, PLC

(57) ABSTRACT

To provide a highly reliable complementary thin film transistor circuit in which deviations in characteristics of a first-conductivity-type thin film transistor and a second-conductivity-type thin film transistor can be reduced or prevented and operated stably. A first-conductivity-type thin film transistor and a second-conductivity-type thin film transistor are formed using single crystal grains, the single crystal grains being formed substantially centered on each of a plurality of starting-point portions provided on an insulating surface of a substrate, wherein the first-conductivity-type thin film transistor and the second-conductivity-type thin film transistor are formed by equalizing their drain current directions, and are formed in the single crystal grains in which at least channel regions of the first-conductivity-type thin film transistor and the second-conductivity-type thin film transistor have the same plane orientation.

8 Claims, 22 Drawing Sheets

U.S. PATENT DOCUMENTS

| | | | |
|---|---|---|---|
| 2003/0132483 A1* | 7/2003 | Yamazaki et al. | 257/347 |
| 2003/0218171 A1* | 11/2003 | Isobe et al. | 257/64 |
| 2003/0219928 A1* | 11/2003 | Kato et al. | 438/128 |
| 2004/0161913 A1* | 8/2004 | Kawasaki et al. | 438/487 |
| 2005/0230755 A1* | 10/2005 | Yamazaki et al. | 257/350 |

FOREIGN PATENT DOCUMENTS

| | | |
|---|---|---|
| JP | A-08-321466 | 12/1996 |
| JP | A 9-172183 | 6/1997 |
| JP | A 2003-289040 | 10/2003 |

OTHER PUBLICATIONS

Ishihara, Ryoichi et al. "Advanced Excimer-Laser Crystallization Techniques of Si Thin-Film for Location Control of Large Grain on Glass." *Flat Panel Display Technology and Display Metrology II* Proceedings of SPIE vol. 4295. 2001, pp. 14-23.

Van der Wilt, Paul, van Dijk, B.D., Bertens, G.J., Ishihara, R., and Beenakker, C.I.M., *Formation of Location-Controlled Crystalline Islands Using Substrate-Embedded Seeds in Excimer-Laser Crystallization Silicone Films,* Sep. 17, 2001, vol. 79, No. 12, pp. 1819-1821.

* cited by examiner

COMPLEMENTARY THIN FILM TRANSISTOR CIRCUIT, ELECTRO-OPTICAL DEVICE, AND ELECTRONIC APPARATUS

BACKGROUND OF THE INVENTION

1. Field of Invention

The present invention relates to a complementary thin film transistor circuit (hereinafter, a CMOS circuit) including thin film transistors (TFTs). More particularly, the present invention relates to a complementary thin film transistor circuit including thin film transistors using a substantially monocrystalline semiconductor film made by performing laser irradiation on a semiconductor film, an electro-optical device, and an electronic apparatus using the same.

2. Description of Related Art

As a method to fabricate a thin film transistor on a general purpose glass substrate at a low temperature, a related art method has been disclosed. A hole is formed in an insulating film on a substrate, an amorphous silicon film is formed on this insulating film and in the hole. Thereafter laser is irradiated on the amorphous silicon film, while maintaining amorphous silicon in a bottom portion of the hole in an unmelted state and the other portions of the amorphous silicon film in a melted state, in order to stimulate crystal growth using the amorphous silicon film that is maintained in non-melted state as a crystal nucleus. Thereby a region is provided centered on the hole in a surface of the amorphous silicon film as a substantially monocrystalline silicon film, See "Single Crystal Thin Film Transistors" (IBM TECHNICAL DISCLOSURE BULLETIN August 1993 pp 257-258) and "Advanced Excimer-Laser Crystallization Techniques of Si Thin-Film For Location Control of Large Grain on Glass" (R. Ishihara et al., proc. SPIE 2001, vol. 4295, p 14-23) described below.

Because this substantially monocrystalline semiconductor film has no crystal grain boundary or less crystal grain boundaries, a barrier, when carriers such as electrons or holes flow, is significantly reduced as compared to a polycrystalline semiconductor film.

By constructing a semiconductor device using this substantially monocrystalline semiconductor film in the semiconductor thin film, an off-current suppressing effect or mobility thereof is good, thereby being capable of easily realizing a thin film transistor that is compatible with high-speed operation.

SUMMARY OF THE INVENTION

In case of constructing a CMOS circuit by an NMOS transistor and a PMOS transistor, if a plane orientation of a semiconductor film in which a channel region of the NMOS transistor is formed and a plane orientation of a semiconductor film in which a channel region of the PMOS transistor is formed are different from each other, deviation in characteristics between the NMOS transistor and the PMOS transistor is generated due to a difference between the plane orientations. This deviation causes the operating states thereof to be instable, thereby leading to malfunction of the CMOS circuit. This happens in the case of fabricating a CMOS circuit using a substantially monocrystalline thin film having a good quality, which is formed by the above-mentioned constructing method.

The present invention, therefore, is conceived to address the related art problems. The present invention provides a highly reliable complementary thin film transistor circuit capable of reducing or preventing deviations in characteristics of a first-conductivity-type thin film transistor and a second-conductivity-type thin film transistor, and of operating stably. Further, the present invention provides an electro-optical device and an electronic apparatus having a high reliability using the complementary thin film transistor circuit.

A complementary thin film transistor circuit according to an aspect of the present invention includes a first-conductivity-type thin film transistor and a second-conductivity-type thin film transistor formed using single crystal grains, the single crystal grains being formed substantially centered on each of a plurality of starting-point portions disposed on an insulating surface of a substrate, the first-conductivity-type thin film transistor and the second-conductivity-type thin film transistor formed by equalizing their drain current directions, and formed in the single crystal grains in which at least the channel regions of the first-conductivity-type thin film transistor and the second-conductivity-type thin film transistor have the same plane orientation.

The thus constructed complementary thin film transistor circuit according to an aspect of the present invention is constructed so plane orientations of the channel regions for the first-conductivity-type thin film transistor and the second-conductivity-type thin film transistor, constituting the complementary thin film transistor circuit, are equalized. In this way, influence on characteristics by the plane orientations applies equally to both the first-conductivity-type thin film transistor and the second-conductivity-type thin film transistor. Thus, the influence, which is caused by the plane orientations, does not apply biasedly to only one transistor. That is, a difference between characteristics of the NMOS transistor and the PMOS transistor constituting the CMOS circuit may be only a requirement that can be physically predicted, such as mobility.

As a result, in this complementary thin film transistor circuit, it is possible to reduce or prevent generation of the characteristic deviation caused by the plane orientations of the channel regions of the first-conductivity-type thin film transistor and the second-conductivity-type thin film transistor constituting the complementary thin film transistor circuit. Therefore, according to the complementary thin film transistor circuit in accordance with an aspect of the present invention, a malfunction due to the difference between the plane orientations of the channel regions is reduced or prevented, thereby realizing a highly reliable complementary thin film transistor circuit having a stable operation.

The thus constructed complementary thin film transistor circuit according to an aspect of the present invention, may have channel regions of the first-conductivity-type thin film transistor and the second-conductivity-type thin film transistor are formed in one single crystal grain. In this way, it is possible to equalize securely the plane orientations of the channel regions of the first-conductivity-type thin film transistor and the second-conductivity-type thin film transistor.

Further, the thus constructed complementary thin film transistor circuit according to an aspect of the present invention may have electric field relief regions including low-concentration impurity regions, the electric field relief regions being formed at both sides of the channel regions for the first-conductivity-type thin film transistor and the second-conductivity-type thin film transistor, and the electric field relief regions and the channel regions are formed in the same single crystal grain. In this way, a highly reliable complementary thin film transistor circuit capable of suppressing the hot electron effect can be constructed.

Further, the thus constructed complementary thin film transistor circuit according to an aspect of the present invention, may have the channel region formed in a region in the single crystal grain that does not include a starting-point portion. Scattering by, for example, crystal defects easily occurs in the region including the starting-point portion, which thus causes a deviation and a degradation of the electric characteristics, such as degradation of mobility. Particularly, if the channel region that greatly affects characteristics of the thin film transistor is formed in the region including the starting point portion, good characteristics cannot be obtained.

Accordingly, a characteristic deviation or degradation of the mobility does not occur by forming a channel region in a region that does not include the starting-point portion, and thus, a complementary thin film transistor circuit having good characteristics, such as mobility, can be constructed.

Also, it is preferable to form the first-conductivity-type thin film transistor and the second-conductivity-type thin film transistor in a semiconductor film in which the single crystal grain is patterned in a U shape or in a semiconductor film in which the single crystal grain is formed in a rectangular shape, in order to form the channel region in the region that does not include the starting-point portion. It is possible to form a thin film transistor avoiding a starting-point portion by forming the first-conductivity-type thin film transistor and the second-conductivity-type thin film transistor in a semiconductor film that is patterned in this shape. That is, the channel region can be formed in a region that does not include a starting-point portion.

Herein, it is preferable that the single crystal grain be formed by performing a heat treatment on the amorphous or polycrystalline semiconductor film. The thus formed single crystal grain becomes a good quality of single crystal grain. A complementary thin film transistor circuit having good characteristics can be realized by forming a thin film transistor using the grain.

Further, the above-mentioned starting-point portion may be a concave portion which is formed on the insulating substrate. In this way, a position at which crystallization originates is easily and securely controlled to form a single crystal grain, thereby realizing a complementary thin film transistor circuit capable of controlling accurately a position to be formed.

In addition, the heat treatment may be carried out on the single crystal grain, in a condition that an unmelted portion is left at a semiconductor film in the concave portion and the other portions are melted. Crystallization of the semiconductor film after the heat treatment, progresses from the inside of the unmelted concave portion, in particular, the vicinity of a bottom portion to the peripheral portion thereof. At this time, by appropriately setting a dimension of the concave portion, only one crystal grain reaches an upper portion (i.e., opening) of the concave portion. At the melted portion of the semiconductor film, since crystallization is performed by adopting one crystal grain arrived at the upper portion of the concave portion as a nucleus, the semiconductor film including the single crystal grain can be formed in a range substantially centered on the concave portion. In this way, a good quality of single crystal grain is obtained, and by using this single crystal grain, a thin film transistor having good characteristics can be realized.

Further, that the above-mentioned heat treatment may be performed by laser irradiation. By using the laser, the heat treatment can be performed effectively and securely, thereby forming a single crystal grain effectively and securely. As laser used herein, there are several lasers, such as an excimer laser, a solid state laser, a gas laser and the like.

The above-mentioned single crystal grain may be a silicon single crystal grain formed by performing a heat treatment on an amorphous or polycrystalline silicon film. In this way, a thin film transistor can be formed using a good quality of silicon single crystal grain, thereby realizing a complementary thin film transistor circuit having good characteristics.

Further, the above-mentioned complementary thin film transistor circuit is suitable for, for example, a driver element for driving a display pixel in a liquid crystal display device or an organic electroluminescent (EL) display device. In this way, it is possible to construct an electro-optical device having an excellent display quality. A good quality of an electronic apparatus can be constructed by constructing the electronic apparatus using the above-mentioned complementary thin film transistor circuit, for example, using this electro-optical device.

DETAILED DESCRIPTION OF PREFERRED EMBODIMENTS

Hereinafter, the exemplary embodiments of the present invention will be described in detail with reference to the accompanying figures. Also, the present invention is not limited to the following description, and may be appropriately altered without departing from the gist of the present invention.

First Exemplary Embodiment

Figure 1:
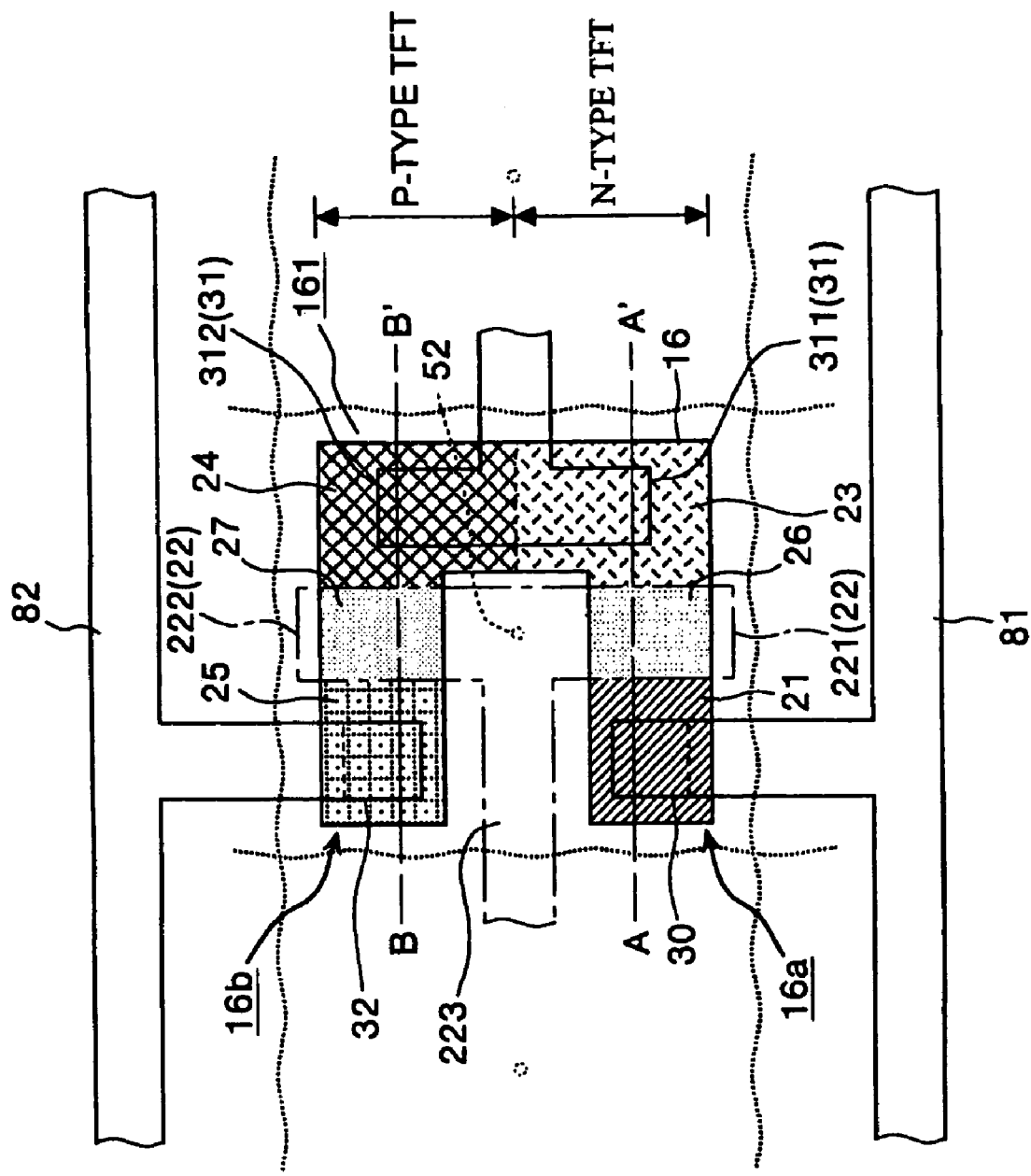
FIG. 1 is a plan view illustrating a CMOS circuit according to an aspect of the present invention.
Figure 2:
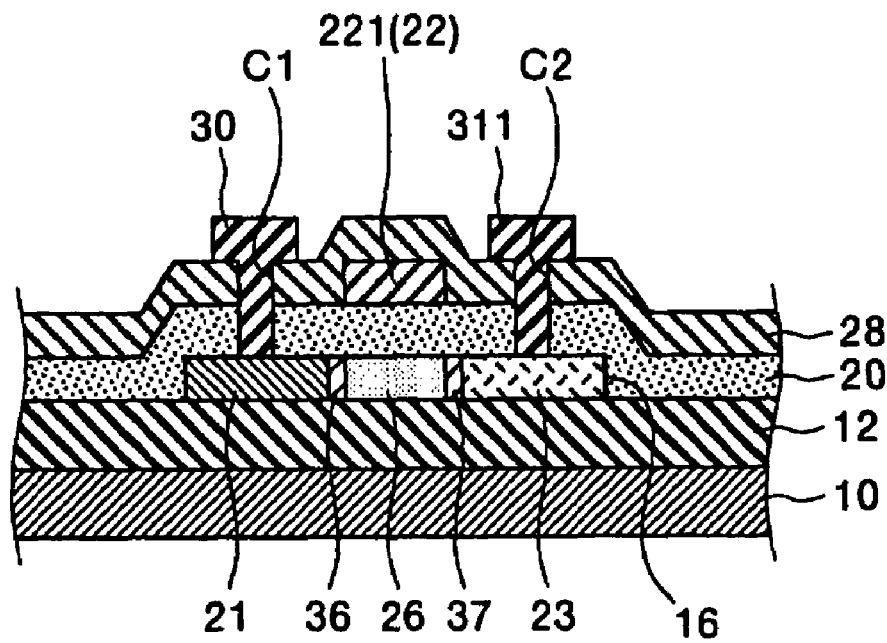
FIG. 2 is a cross-sectional view taken along the plane A-A' of FIG. 1.
Figure 3:
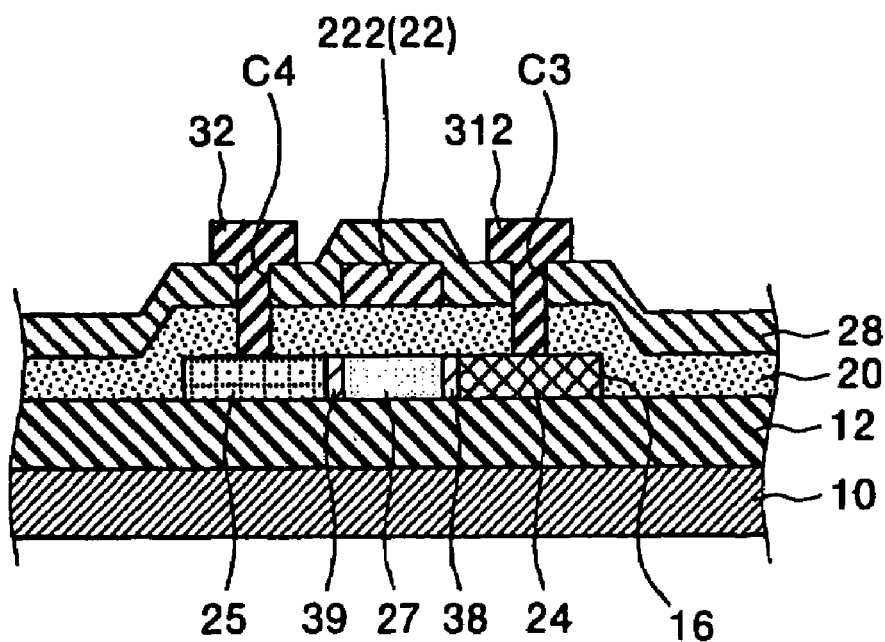
FIG. 3 is a cross-sectional view taken along the plane B-B' of FIG. 1.
Figure 4:
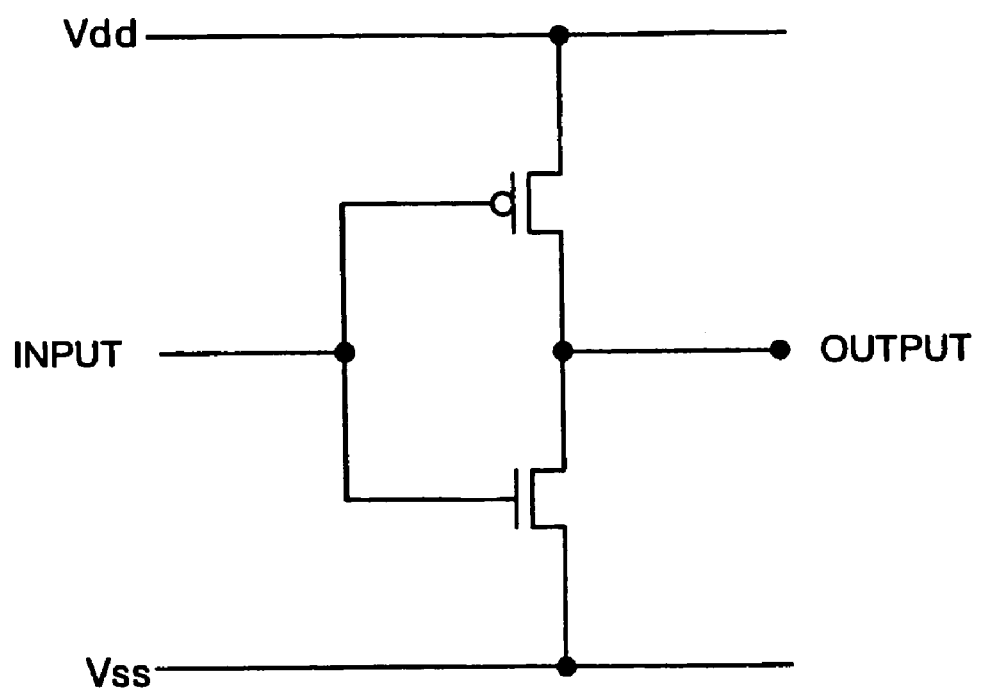
FIG. 4 is a circuit schematic of the CMOS circuit shown in FIG. 1.

FIGS. 1 to 3 illustrate a CMOS inverter (hereinafter, inverter); which is a NOT circuit constructed using a CMOS circuit, according to an aspect of the present invention. FIG. 1 is a plan view, FIG. 2 is a cross-sectional view taken along plane A-A' of FIG. 1. FIG. 3 is a cross-sectional view taken along plane B-B' of FIG. 1. Also, a circuit schematic of this CMOS circuit is shown in FIG. 4. Further, in FIG. 1, a gate electrode and transistor regions (source region, drain region, and channel region) are primarily highlighted, and the other elements are omitted. Further, in FIG. 1, in order to easily recognize shapes of a channel region 26 and the like, a gate electrode 22 is denoted by a dashed line, and is denoted through the underlying channel region 26 and the like.

The inverter according to the present exemplary embodiment is constructed by forming two types of thin film transistors, a first-conductivity-type thin film transistor and a second-conductivity-type thin film transistor, on a glass substrate 10, as shown in FIGS. 2 and 3. Hereinafter, the construction thereof will be described in detail.

As shown in FIGS. 2 and 3, an insulating film 12 is formed on a glass substrate 10. Also, as shown in FIG. 1, a semiconductor film, which becomes a transistor region, namely, a silicon film 16 in which a substantially monocrystalline silicon film is patterned in a U shape, is formed on the insulating film 12. As shown in FIG. 1, a plurality of starting-point portions 52, which become starting points upon crystallization of the substantially monocrystalline silicon film, are formed in a concave shape in the thickness direction at a substantially central portion of a region surrounded by a silicon film 16 formed in a U shape on the insulating film 12. In the following description, this starting-point portion (i.e., concave portion) is called "grain filter". The grain filter 52 is buried by a silicon film 16. Herein, the silicon film 16 uses, as described below, a plurality of single crystal grains formed centered on the grain filter 52, specifically, a single crystal grain 161 of adjacent single crystal grains formed in a substantially square shape.

Also, two types of thin film transistors, namely, an N-type MOS transistor (hereinafter, NMOS transistor) and a P-type MOS transistor (hereinafter, PMOS transistor) are formed one by one in this single crystal grain 161, and thus the CMOS circuit includes these thin film transistors.

The NMOS transistor is formed using a substantially rectangular region including the protrusion 16a in the silicon film 16 patterned in a U shape while avoiding the region including the grain filter 52, as shown in FIG. 1. A front-end region of the protrusion 16a of this substantially rectangular region is a high-concentration source region 21, and an opposite region is a high-concentration drain region 23. The region sandwiched between the source region 21 and the drain region 23 is the channel region 26.

Further, as shown in FIG. 2, electric field relief regions 36 and 37 including low-concentration impurity regions, are formed at both sides, with the channel region 26 therebetween, and have a LDD (Lightly Doped Drain) structure. In this way, the hot electron effect is suppressed, thereby constructing a highly reliable thin film transistor. Further, in an aspect of the present invention, the LDD structure, in which the electric field relief regions 36 and 37 are provided, is not essential. A structure such that the electric field relief regions are not provided is also allowed.

Moreover, over the channel region 26, a gate electrode 221 constituting the gate electrode 22 together with a gate electrode 222 of PMOS transistor described below is formed in a direction substantially perpendicular to a substantially long rectangular side, with the silicon oxide film 20 therebetween; a silicon oxide film 28 is also formed.

Over the source region 21, a source electrode 30 is formed, with the silicon oxide film 20 and the silicon oxide film 28 therebetween. The source electrode 30 is connected to the source region 21 via a contact hole C1.

Further, over the drain region 23, a drain electrode 311 for output is formed, with the silicon oxide film 20 and the silicon oxide film 28 therebetween. Herein, an output drain electrode 311 constitutes a common drain electrode 31, together with an output drain electrode 312 of the PMOS transistor. In addition, the drain electrode 311 is connected to the drain region 23 via the contact hole C2.

Meanwhile, the PMOS transistor is formed using a substantially rectangular region containing a protrusion 16b in the silicon film 16 that is patterned in a U shape, as shown in FIG. 3. Among this substantially square region, a front-end region of the protrusion 16b is a high-concentration source region 25, and an opposite region is a high-concentration drain region 24. In addition, the region sandwiched between the source region 25 and the drain region 24 is the channel region 27.

Further, as shown in FIG. 3, the electric field relief regions 38 and 39, each composed of a low-concentration impurity region, are formed at both sides, with the channel region 27 therebetween, and have the LDD structure. In this way, the hot electron effect is suppressed, thereby constructing a highly reliable thin film transistor. Further, in an aspect of the present invention, the LDD structure, in which the electric field relief regions 38 and 39 are provided, is not essential. A structure such that the electric field relief regions are not provided is also allowed.

Furthermore, over the channel region 27, a gate electrode 222 constituting the electrode 22, together with the gate electrode 221 of the NMOS transistor is formed:in a direction substantially perpendicular to a long side of a substantially rectangle, with the silicon oxide film 20 therebetween. A silicon oxide film 28 is also formed.

Over the source region 25, a source electrode 32 is formed, with the silicon oxide film 20 and the silicon oxide film 28 therebetween. The source electrode 32 is connected to the source region 25 via a contact hole C4.

Further, over the drain region 24, an output drain electrode 312 is formed, with the silicon oxide film 20 and the silicon oxide film 28 therebetween. Herein, an output drain electrode 312 constitutes a common drain electrode 31, together with the drain electrode 311 of the NMOS transistor. In addition, the drain electrode 312 is connected to the drain region 24 via the contact hole C3.

In case of constructing the CMOS circuit by forming the NMOS transistor and the PMOS transistor in regions having different plane orientations, respectively, and specifically, in crystal grains having different plane orientations, an operation state of these two thin film transistors, namely, deviation in characteristics occurs due to a difference between plane orientations of a formation region. This deviation of the characteristics may cause malfunction and affect the reliability of circuit operation.

Thus, in an inverter of the present exemplary embodiment, both the NMOS transistor and the PMOS transistor constituting the CMOS circuit are formed in a region in one single crystal grain. Stating more specifically, in the NMOS transistor and the PMOS transistor constituting the CMOS circuit, a channel region that most greatly affects characteristics of the thin film transistor is formed in one single crystal grain. Also, directions, in which a drain current in both thin film transistors flows, are made consistent for the sake of the configuration. In addition, in the case of having the LDD structure, the electric field relief region is also formed at a region in one single crystal grain.

By adopting this configuration, it is possible to make plane orientations of the channel region for the NMOS transistor and the PMOS transistor and the electric field relief region consistent, which constitute the CMOS circuit. Accordingly, because an influence of the plane orientations to the characteristics equally applies to both the NMOS transistor and the PMOS transistor, an influence caused by plane orientations does not apply biasedly to only one transistor. That is, the difference between the characteristics of the NMOS transistor and the PMOS transistor constituting the CMOS circuit may be only a requirement that can be physically predicted, such as mobility.

As a result, it is possible to obtain an effect of reducing or preventing generation of deviation between characteristics caused by plane orientations of the channel region and the electric field relief region in the NMOS transistor and the PMOS transistor constituting a CMOS circuit. Accordingly, a malfunction caused by the difference between plane orientations of the channel region and the electric field relief region is reduced or prevented by this inverter, thereby realizing a highly reliable inverter having stable operation.

Further, in this inverter, each thin film transistor is formed while avoiding the region including the grain filter 52.

Normally, scattering by, for example, crystal defects easily occurs in the region including the grain filter 52, thus causing deviation and degradation of the electrical characteristics, such as degradation of mobility. Particularly, when the channel region that most greatly affects the characteristics of the thin film transistor is formed in the region including the grain filter 52, good characteristics cannot be obtained.

However, in this inverter, because the thin film transistor, specifically, the channel regions 26 and 27 are formed while avoiding the grain filter 52, deviation or degradation of mobility is not caused due to the influence of the grain filter 52, thereby realizing the CMOS circuit having excellent characteristics, such as mobility or the like.

Further, although the CMOS circuit is constructed by forming all components of the NMOS transistor and the PMOS transistor on the single crystal grain 161 in the present exemplary embodiment, any elements, such as the source region or drain region other than the above-mentioned channel region and the electric field relief region, can be constructed to be extended into the adjacent single crystal grains. Specifically, the PMOS transistor and the NMOS transistor may be formed using a plurality of single crystal grains, respectively. Even when thus constructed, because the channel regions of the NMOS transistor and the PMOS transistor and the electric field relief region are formed in one single crystal grain and the plane orientations are equalized, the above-mentioned effect of an aspect of the present invention can be obtained.

Figure 14:
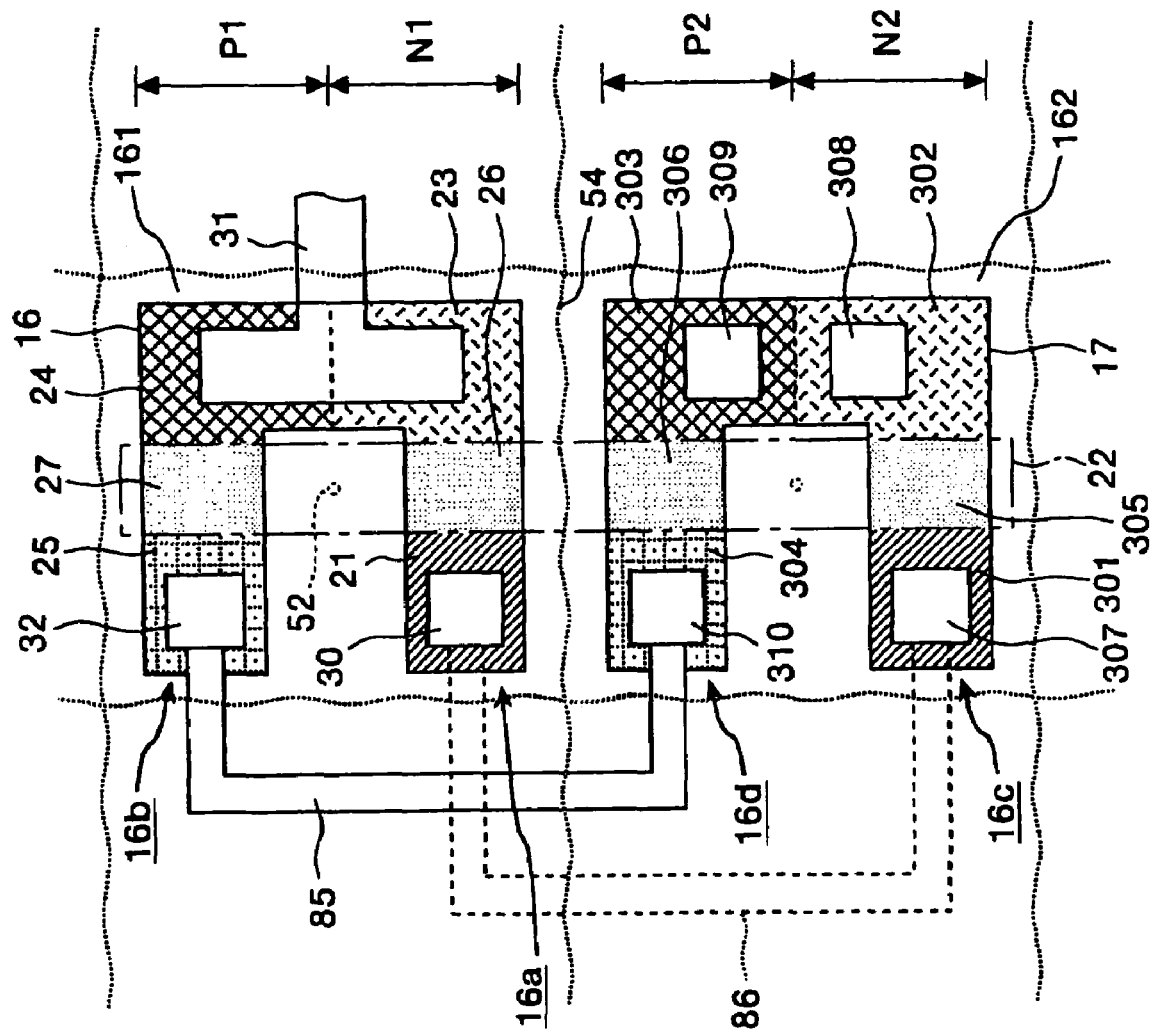
FIG. 14 is a plan view illustrating another CMOS circuit according to an aspect of the present invention.

Further, although a form in which an area of the drain electrode 31 is taken in a large size and an output is derived from a common electrode by obtaining each contact from the drain regions 23 and 24 of the NMOS transistor and the PMOS transistor has been described in the present exemplary embodiment, a contact for the output itself may be shared. Specifically, a contact for the output, a drain electrode, is shared between the NMOS transistor and the PMOS transistor, and is formed, for example, as shown in FIG. 14, on a crystal grain boundary 54 of adjacent single crystal grains 161 and 162. Herein, there is an advantage in that it is easy to come in contact with a metal, which becomes an electrode, because a semiconductor film protrudes from other regions on the crystal grain boundary.

This inverter can be fabricated by performing the following processes. The method of fabricating the inverter includes a process of forming a silicon film used as an active region of a thin film transistor on a glass substrate, and a process of forming the thin film transistor using the formed silicon film. Hereinafter, each process will be described in detail.

Figure 5:
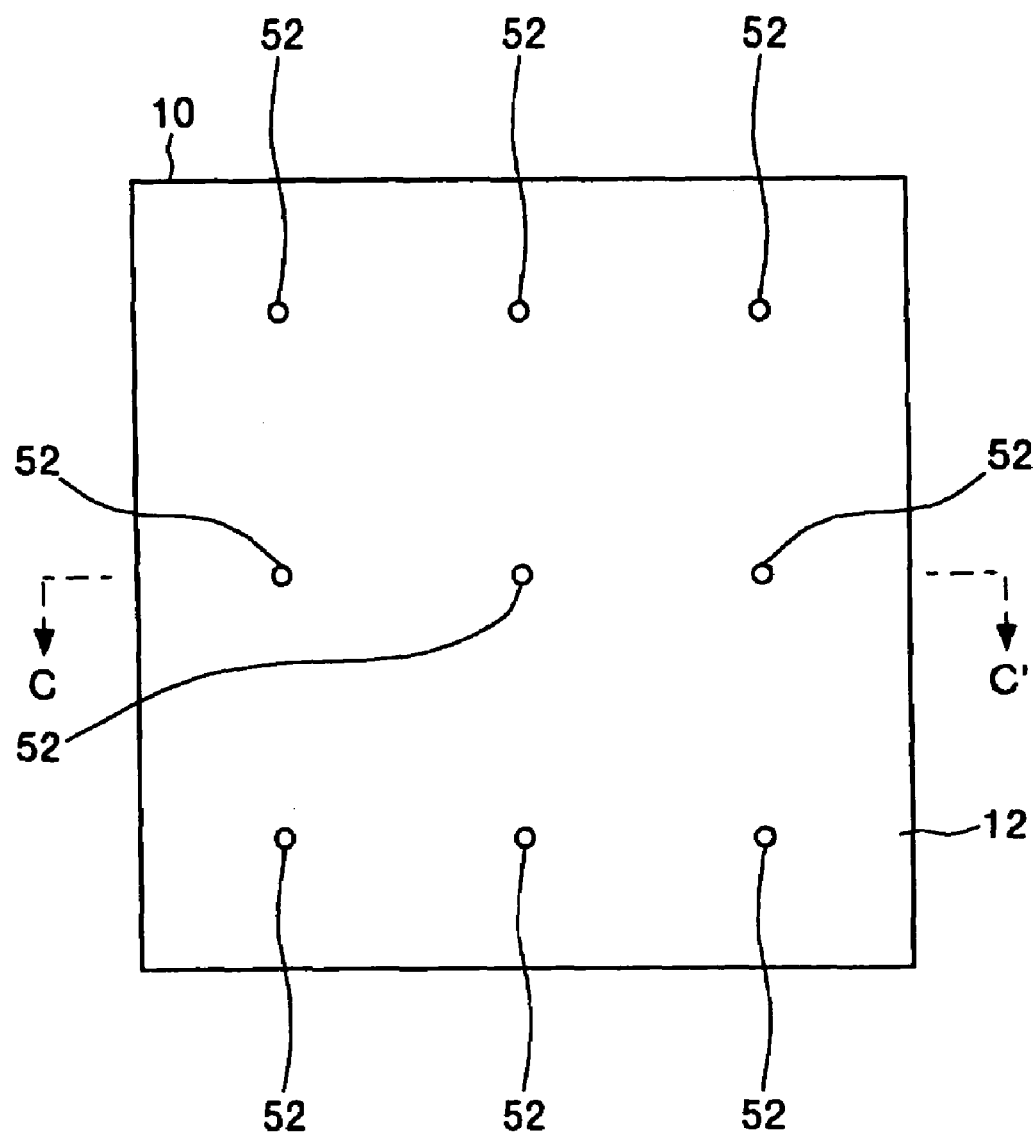
FIG. 5 is a plane view explaining a method of forming a silicon film.

FIGS. 5 and 6 explain a process of forming a silicon film. FIG. 5 illustrates a partial plan view of the glass substrate 10 on which the silicon film is formed. FIG. 6 corresponds to a section taken along plane C-C' shown in FIG. 5.

Figure 6A:
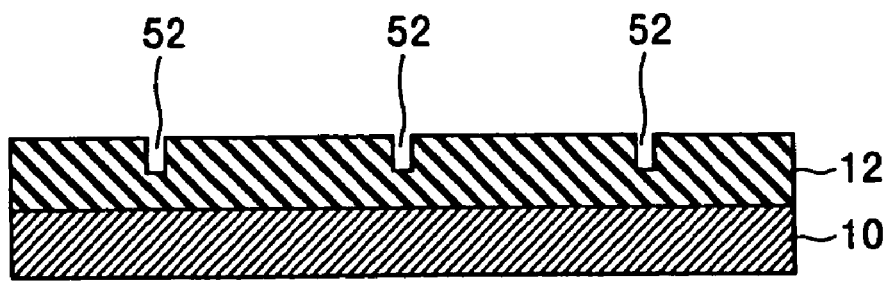
FIG. 6 is a process view explaining a method of forming a silicon film.

As shown in FIGS. 5 and 6(A), a silicon oxide film 12 as an insulating film is formed on the glass substrate (insulating substrate) 10. This silicon oxide film 12 can be formed by various film forming methods, such as a plasma enhanced chemical vapor deposition (PECVD) method, low-pressure chemical vapor deposition (LPCVD) method, a sputtering method or the like.

Next, a plurality of starting-point portions 52 that become starting points upon crystallization of the semiconductor film, namely, grain filters 52, are formed in the silicon oxide film 12 by appropriately setting the displacement intervals so that they are arranged regularly. This grain filter 52 serves to preferentially grow only one crystal nucleus and is formed in a concave shape. The grain filter 52 in the present exemplary embodiment may be formed in, for example, a cylindrical shape having a diameter of about 100 nm and a height of about 750 nm. Further, apart from the cylindrical shape, the grain filter 52 may have, for example, a prism shape.

For example, the grain filter 52 can be formed as follows. First of all, the silicon oxide film 12 is coated with a photoresist film using a mask positioned on the grain filter 52. This photoresist film is exposed and developed to form a photoresist film (not shown) having an opening to expose a formation position of the grain filter 52 on the silicon oxide film 12.

Next, the formation position of the grain filter 52 is etched selectively, by performing reactive ion etching using the photoresist film as a mask. Thereafter, the grain filter 52 can be formed by eliminating the photoresist film on the silicon oxide film 12.

Further, in forming the grain filter 52 to have a smaller diameter, it can be formed by forming a concave portion and thereafter growing an oxide film on a sidewall of the concave portion (hole portion) in the radial direction by the PECVD method or the like, to make the hole diameter small.

Figure 6B:
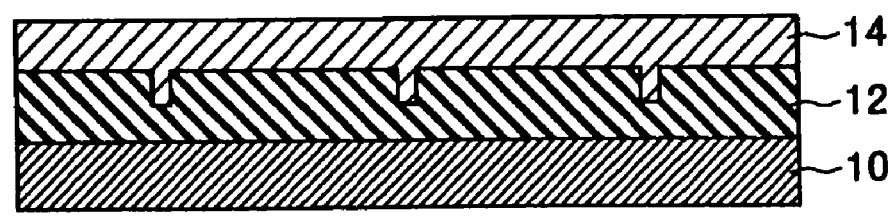

Next, as shown in FIG. 6(B), a semiconductor film is formed on the silicon oxide film 12 and in the grain filter 52 by a film forming method, such as an LPCVD method or the like. In the present exemplary embodiment, an amorphous silicon film 14 is formed as the semiconductor film. This amorphous silicon film 14 may be formed to have a film thickness of about 50 to 500 nm. Alternatively, a polycrystalline silicon film may be formed in place of the amorphous silicon film 14.

Figure 6C:
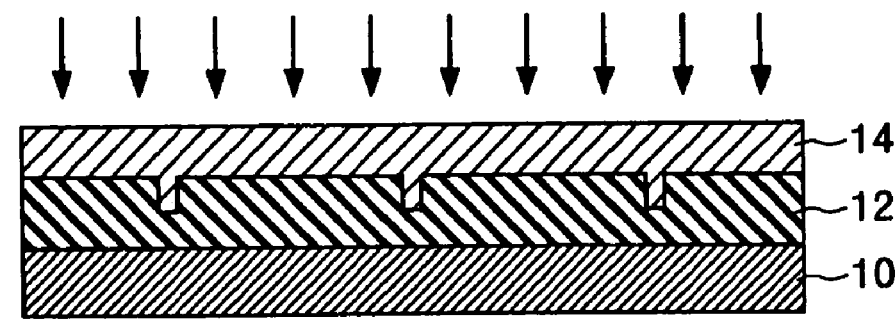

Next, as shown in FIG. 6(C), the amorphous silicon film 14 is annealed by laser irradiation, and a plurality of single crystal grains are formed substantially centered on each grain filter 52. This laser irradiation may be carried out by using, for example, a XeCl pulsed excimer laser having a wavelength of 308 nm and a pulse width of 20 to 30 ns so that the energy density is 0.4 to 1.5 J/cm². By performing the laser irradiation in this condition, most of the irradiating laser light is absorbed at the vicinity of the surface of the silicon film 14. This is because an absorption coefficient of the amorphous silicon is relatively large, namely, 0.139 $nm^{-1}$ at the a wavelength (308 nm) of the XeCl pulsed excimer laser.

Further, in the laser irradiation to the silicon film 14, the irradiation method can be appropriately selected according to the capability (irradiatable area) of the laser irradiation apparatus used. For example, if the irradiatable area is small, a method of selectively irradiating each grain filter 52 and a peripheral area thereof can be considered. Further, if the irradiatable area is relatively large, a method of sequentially selecting ranges including several grain filters 52 and repeating laser irradiation to these ranges several times, or the like can be considered. Further, in the case of high device capability, a range including all grain filters 52 may be laser-irradiated by a single laser irradiation.

By properly selecting the condition of the above-mentioned laser irradiation, an unmelted portion of the silicon film 14 is left at the bottom portion in the grain filter 52, and the other portions are substantially completely melted. In this way, silicon crystal growth after laser irradiation first originates from the unmelted portion around the bottom portion of the grain filter 52, toward the vicinity of the surface of the silicon film 14, namely, the substantially completely melted state portion.

Figure 6D:
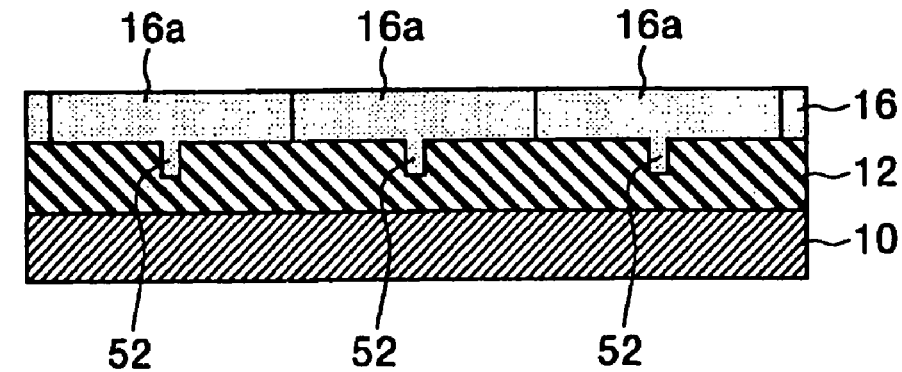

Several crystal grains are generated at the bottom portion of the grain filter 52. At this time, only one crystal grain reaches the top portion (opening) of the grain filter 52 by setting a cross sectional dimension of the grain filter 52, (diameter of a circle in the present exemplary embodiment) identical to or slightly smaller than one crystal grain. In this way, at the substantially complete melted state portion of the silicon film 14, a crystal growth progresses by using one crystal grain arriving to the upper portion of the grain filter 52 as a nucleus, and the silicon film 16 is formed by regularly arranging crystal grains of a large grain diameter centered on the grain filter 52, that is, the silicon films 16a composed of the substantially single crystal grains, as shown in FIG. 6(D).

Figure 7:
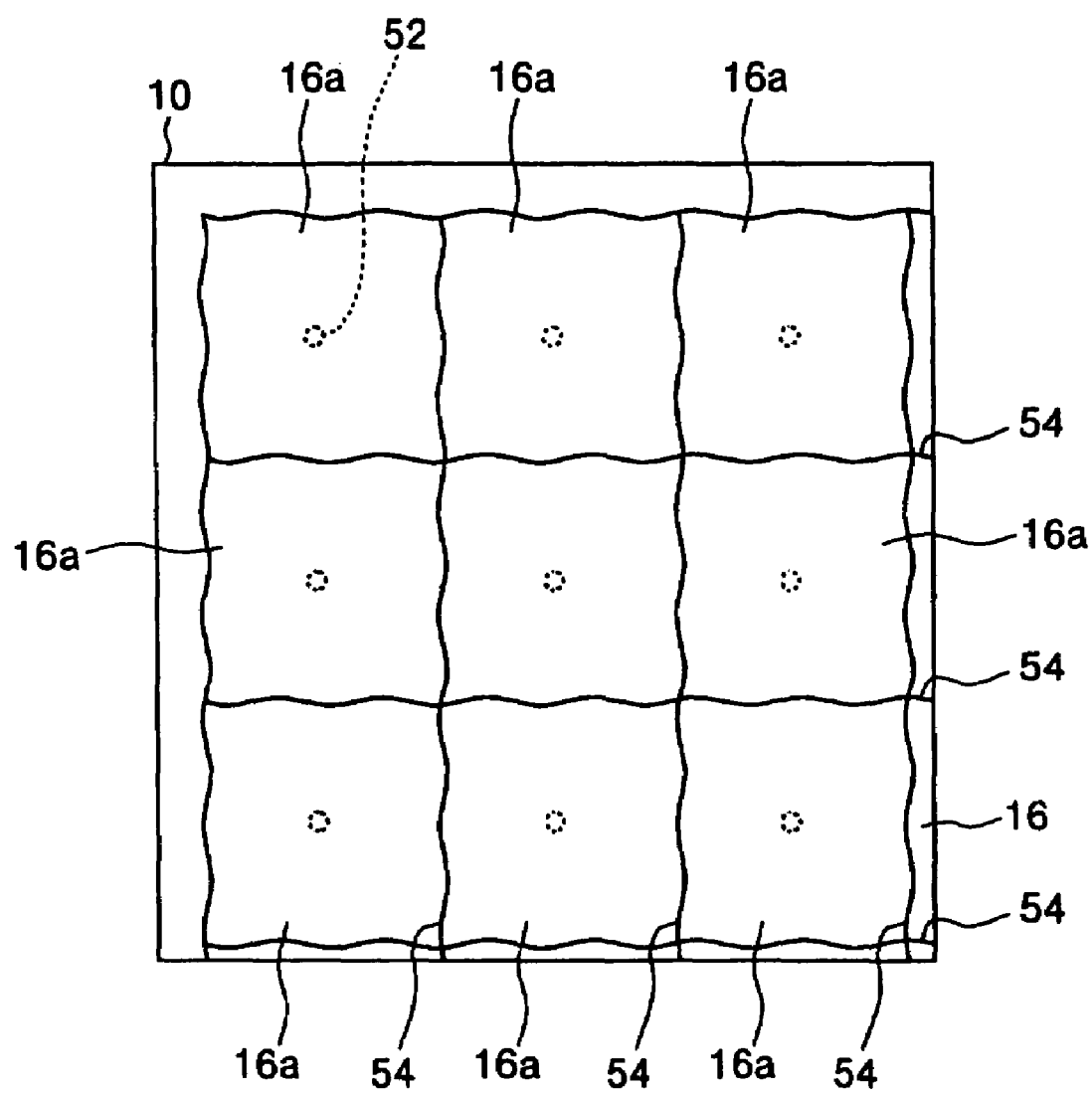
FIG. 7 is a plane view illustrating a silicon film formed on a glass substrate.

FIG. 7 is a plan view illustrating a silicon film 16 formed on the glass substrate 10. As shown in the same figure, each silicon film 16a is formed in a range substantially centered on each grain filter 52. A crystal grain boundary 54 is produced in a position contiguous with a peripheral portion of each silicon film 16a. A thin film transistor is formed using this silicon film 16 formed by arranging the silicon films 16a regularly, to construct the CMOS circuit shown in FIGS. 1 to 4.

Next, a process of forming a thin film transistor using the silicon film 16 (device forming process) will be described.

Figure 8:
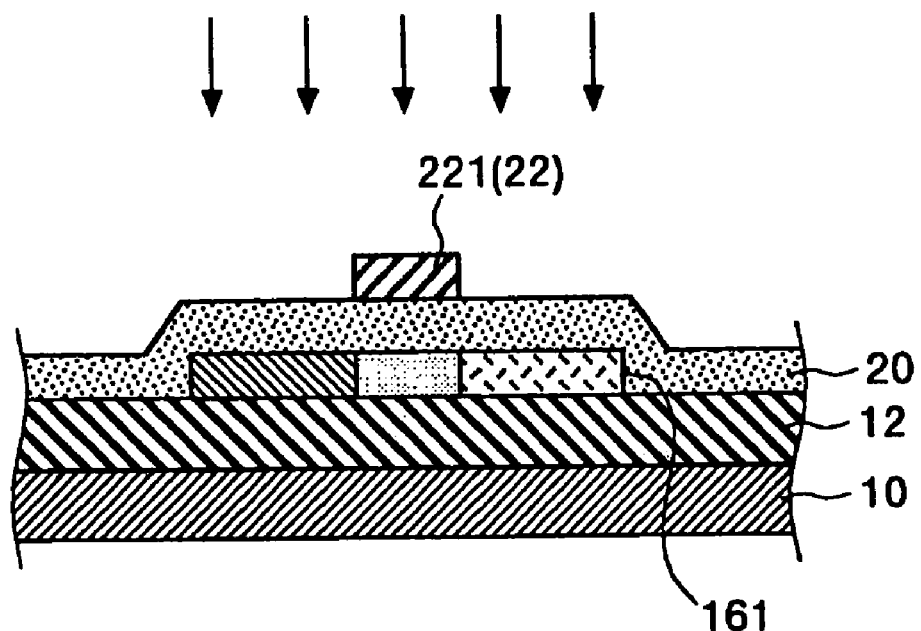
FIG. 8 is a process view explaining a method of fabricating a CMOS circuit.
Figure 9:
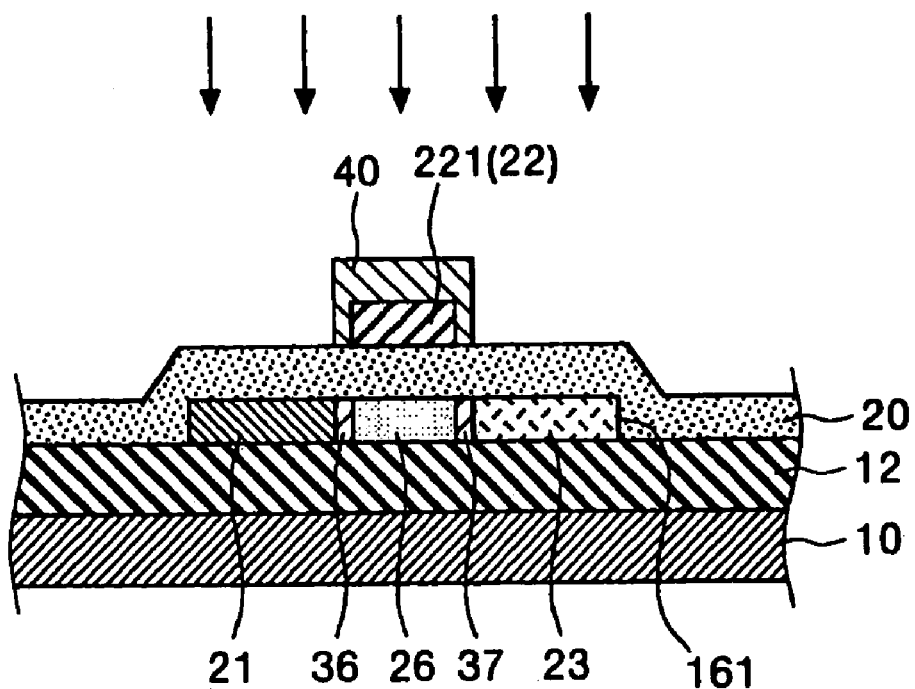
FIG. 9 is a process view explaining a method of fabricating a CMOS circuit.

FIGS. 8 to 13 illustrate a process of forming a CMOS transistor using the above-mentioned silicon film 16. Further, FIG. 8 is a cross-sectional view taken along plane A-A' of FIG. 1, representing a longitudinal sectional view illustrating a construction of the NMOS transistor. Also, FIG. 9 is a sectional view taken along plane B-B' of FIG. 1, which is a longitudinal sectional view showing a construction of a PMOS transistor.

First of all, only a single crystal grain 161 of silicon, being one silicon film 16a in the above-mentioned silicon film 16, is selected and is patterned so that a U shape of the silicon film leaves in this single crystal grain 161. A portion unnecessary to form the CMOS transistor is eliminated to shape the transistor region.

Herein, in the U-shaped silicon film, specifically the transistor region, one side of a substantially half region (i.e., a lower half region in FIG. 1), with the grain filter 52 therebetween, is a transistor region for the NMOS transistor. Further, in the U-shaped transistor region, the other side of a substantially half region (an upper half region in FIG. 1) with the grain filter 52 therebetween is a transistor region for the PMOS transistor.

Next, a silicon oxide film 20 is formed on the upper surfaces of the silicon oxide film 12 and a patterned silicon film 16 by a film forming method, such as an electron cyclotron resonance PECVD method (ECR-PECVD method), a PECVD method, or the like. This silicon oxide film 20 functions as a gate insulating film of the thin film transistor.

Figure 10:
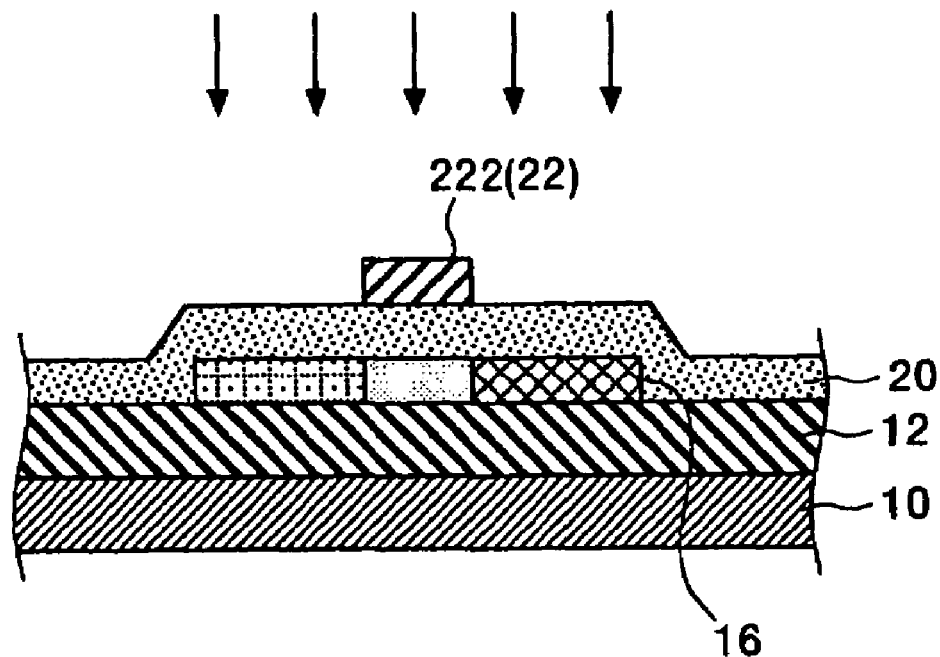
FIG. 10 is a process view explaining a method of fabricating a CMOS circuit.

Next, gate electrodes 221 and 222 (22) which are extended over a transistor region of the NMOS transistor and a transistor region of the PMOS transistor, are formed by forming and patterning a metal thin film, such as tantalum, aluminum or the like by a film forming method, such as a sputtering method or the like, as shown in FIGS. 8 and 10. Herein, in forming the gate electrodes 221 and 222 (22), they may be formed in a region in which the grain filter 52 is included.

Next, N-type source and drain regions are formed in a self-alignment manner by forming a resist mask (not shown) in the entire transistor region for the PMOS transistor, and by ion-implanting N-type impurity elements at low concentration.

Subsequently, as shown in FIG. 9, a resist mask 40 covering the gate electrode 221 widely is formed in the transistor region for the NMOS transistor, N-type impurity elements are ion-implanted at high concentration, and a XeCl excimer laser is adjusted and is irradiated to an energy density of about 400 mJ/cm² to activate the impurity elements. As a result, the source region 21 of a high-concentration impurity region, the electric field relief region 36 of a low-concentration impurity region, the drain region 23 of a high-concentration impurity region and the electric field relief region 37 of a low-concentration impurity region are formed. Also, a portion, in which the impurities are not introduced, becomes the channel region 26. By doing so, the LDD-structure NMOS transistor can be formed.

Next, the resist mask formed in the transistor region for the PMOS transistor and the resist mask 40 are removed. Source and drain regions of the P-type are formed in a self-alignment manner by forming a resist mask (not shown) over the transistor region for the NMOS transistor and ion-implanting the P-type impurity elements at low concentration.

Figure 11:
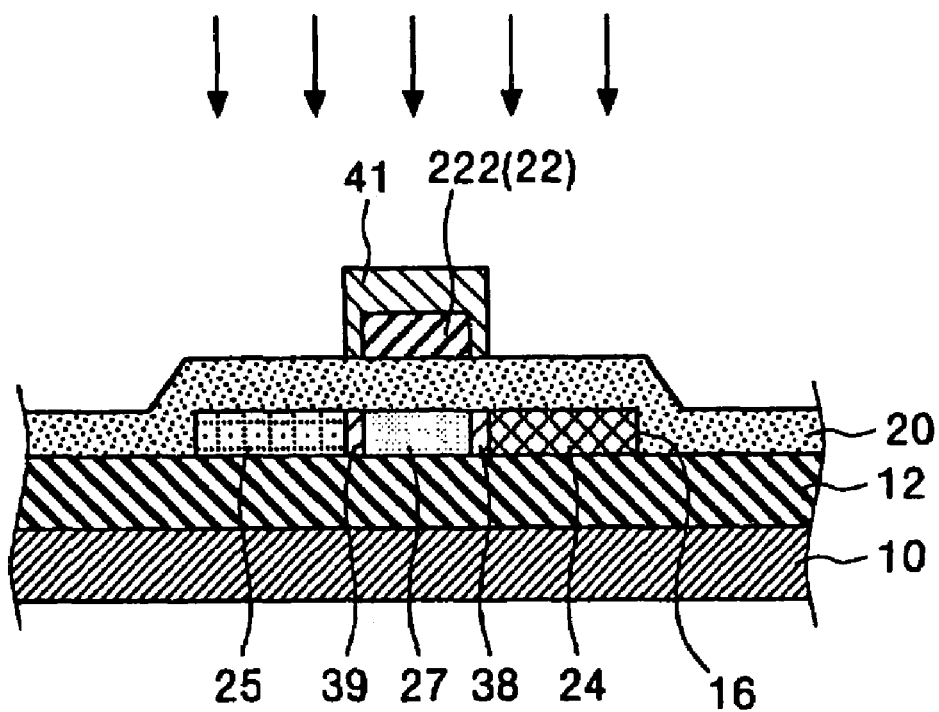
FIG. 11 is a process view explaining a method of fabricating a CMOS circuit.

Subsequently, as shown in FIG. 11, a resist mask 41 covering the gate electrode 222 widely is formed on a transistor region for the PMOS transistor, P-type impurity elements are thereafter ion-implanted at high concentration, and a XeCl excimer laser is adjusted and irradiated to a energy density of about 400 mJ/cm$^2$ to activate the impurity elements. As a result, the source region 25 of a high-concentration impurity region, the electric field relief region 39 of a low-concentration impurity region, the drain region 24 of a high-concentration impurity region, and the electric field relief region 38 of a low-concentration impurity region are formed. Further, a portion, in which impurities are not introduced, is the channel region 27. In this way, the PMOS transistor of the LDD structure can be formed. Thereafter, the resist mask formed in the transistor region for the NMOS transistor and the resist mask 41 are removed.

Further, the aforementioned impurity elements may be activated by carrying out a heat treatment at a temperature of about 250° C. to 400° C. instead of the laser irradiation.

Figure 12:
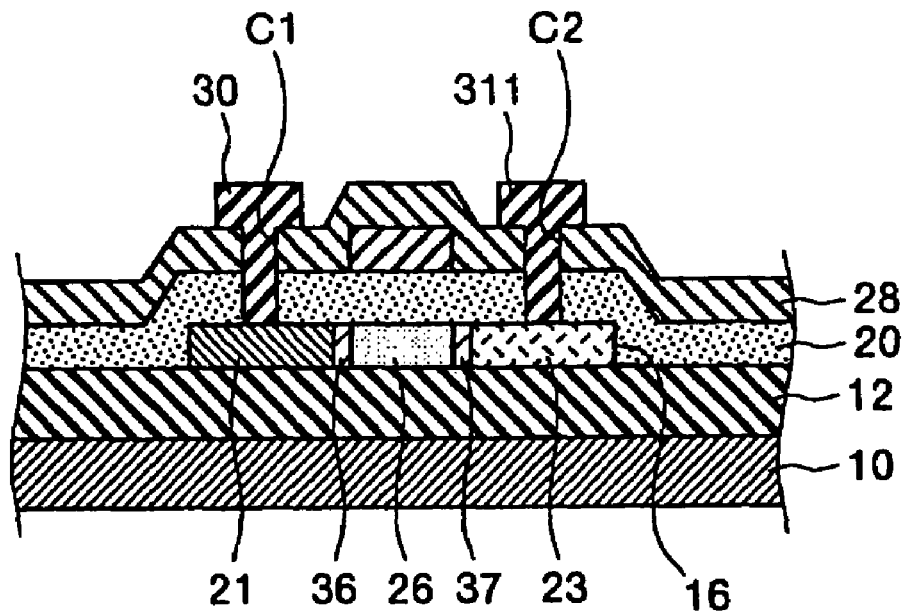
FIG. 12 is a process view explaining a method of fabricating a CMOS circuit.
Figure 13:
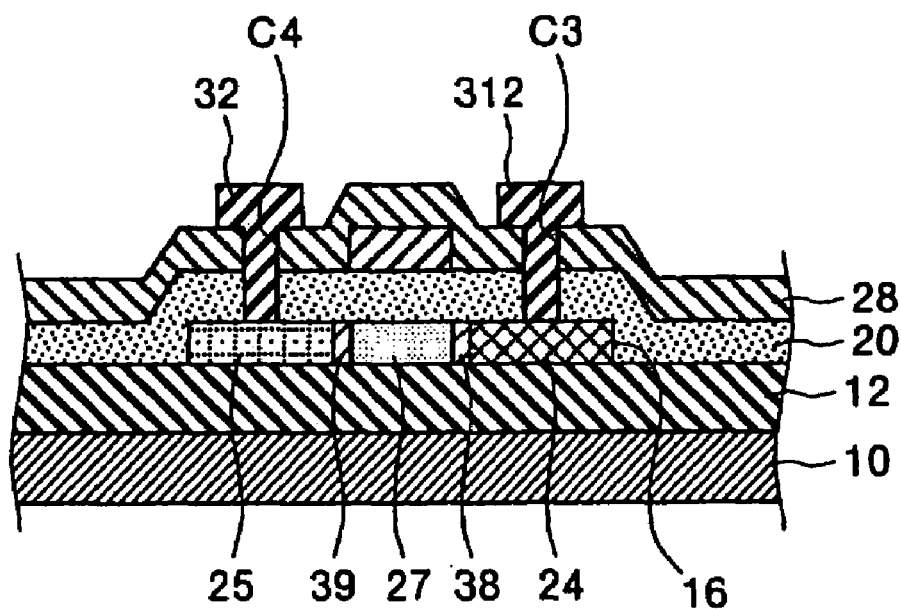
FIG. 13 is a process view explaining a method of fabricating a CMOS circuit.

Next, as shown in FIGS. 12 and 13, a silicon oxide film 28 having a film thickness of about 500 nm is formed on the upper face of the silicon oxide film 20 and the gate electrode 22 by a film forming method, such as the PECVD method or the like. Then, contact holes C1 and C4 reaching the respective source regions 21 and 25 by passing through the silicon oxide films 20 and 28 are formed, and a metal, such as aluminum, tungsten, or the like, is buried in these contact holes C1 and C4 by a film forming method, such as the sputtering method or the like, and thereafter, the source electrodes 30 an 32 are formed by a patterning.

Further, the contact holes C2 and C3, which are connected to the respective drain regions 23 and 24, are formed passing through the silicon oxide films 20 and 28 in a region laid across the drain region 23 and the drain region 24. Also, a common drain electrode 31, composed of the drain electrode 311 and the drain electrode 312, is formed by burying these contact holes C2 and C3 with a metal, such as aluminum or tungsten, by a film forming method, such as a sputtering method, and thereafter patterning them. The inverter of the present exemplary embodiment is formed by the above-described fabricating method.

Second Exemplary Embodiment

Figure 15:
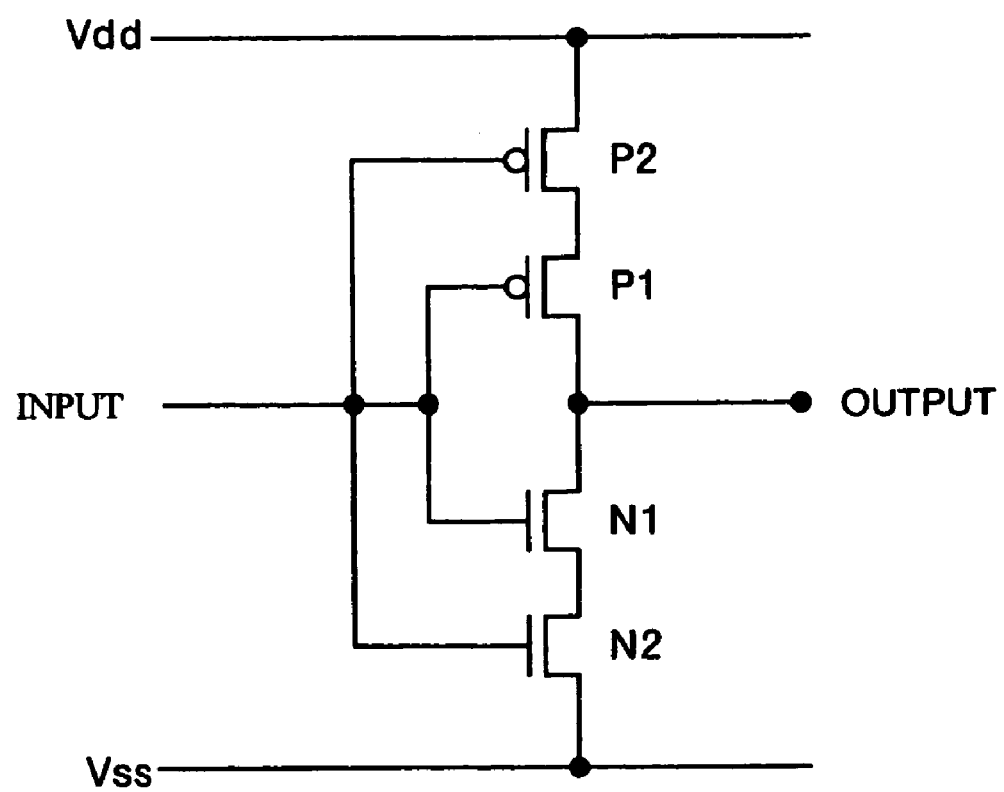
FIG. 15 is a circuit schematic of the CMOS circuit shown in FIG. 14.

FIGS. 14 and 15 illustrate the construction of another CMOS inverter constructed by using the CMOS circuit according to an aspect of the present invention, in which FIG. 14 is a plane view and FIG. 15 is a circuit schematic. Also, in FIG. 14, the gate electrode and transistor regions (source region, drain region, and channel region) are primarily highlighted, and other elements are omitted. Further, to assist the understanding, the same members as those of the above-mentioned first exemplary embodiment are imparted with similar reference numerals.

The inverter according to the present exemplary embodiment is constructed by adding one NMOS transistor and one PMOS transistor in the CMOS circuit shown in FIG. 1 as shown in FIG. 14.

Herein, in the added NMOS transistor and PMOS transistor, the monocrystalline silicon film 17 is formed, the film 17 being the transistor region in which the single crystal grain 162 adjacent to the single crystal grain 161, with the crystal grain boundary 54 therebetween, is patterned in a U shape avoiding the region including the grain filter 52. That is, the CMOS circuit includes four thin film transistors, such as NMOS transistor N1 and PMOS transistor P1, formed on the single crystal grain 161, and NMOS transistor N2 and PMOS transistor P2, formed on the single crystal grain 162. Herein, the single crystal grain 161 has the first plane orientation and the single crystal grain 162 has the second plane orientation, which is different from the first orientation.

Also, since the NMOS transistor N1 and PMOS transistor P1, is the same as those of the first exemplary embodiment, the detailed description about those transistors will be omitted by referring to the above description.

In the U-shaped monocrystalline silicon film 17, with the grain filter 52 therebetween, one part of almost half of a substantially rectangular region (the half region of the lower side in FIG. 14) becomes the transistor region for NMOS transistor N2. And, in the U-shaped monocrystalline silicon film 17, with the grain filter 52 therebetween, the other part of almost half of a substantially rectangular region (the half region of the upper side in FIG. 14) becomes the transistor region for PMOS transistor P2.

The NMOS transistor N2 is formed in one part of almost half of a substantially rectangular region in the monocrystalline silicon film 17 patterned in a U shape, with the grain filter 52 therebetween, specifically a substantially rectangular region including the protrusion 16c as shown in FIG. 14. In the substantially rectangular region, the tip region of the protrusion 16c becomes high density of drain region 301, and the opposite region thereof becomes high-density source region 302. In addition, the region sandwiched between the source region 302 and drain region 301 is the channel region 305.

The gate electrode 22, which is commonly used in the NMOS transistor N1 and PMOS transistor P1, is formed in the upper side of the substantially rectangular channel region 305 in a direction substantially perpendicular to the long side of the rectangle.

And, in the upper side of the source region 302, the source electrode 308 is formed, and the source electrode 308 is connected with the source region 302 via a contact hole (not shown). Also, in the upper side of the drain region 301, the drain electrode 307 is formed, and the drain electrode 307 is connected to the drain region 301 via a contact hole (not shown).

The PMOS transistor P2 is formed in the other part of almost half of a substantially rectangular region in the monocrystalline silicon film 17 patterned in a U shape, with the grain filter 52 therebetween, particularly a substantially rectangular region including the protrusion 16d as shown in FIG. 14. In the substantially rectangular region, the tip region of the protrusion 16d becomes high-density drain region 304, and the opposite region thereof becomes high-density source region 303. Further, the region sandwiched between the source region 303 and the drain region 304 is the channel region 306.

Also, in the upper side of the channel region 306, the gate electrode 22, which is commonly used in the NMOS transistor N1 and PMOS transistor P1, is formed in the substantially perpendicular direction to the long side of a substantially rectangle.

In the upper side of the source region 303, the source electrode 309 is formed, and the source electrode 309 is connected to the source region 303 via a contact hole (not shown). Also, in the upper side of the drain region 304, the drain electrode 310 is formed, and the drain electrode 310 is connected to the drain region 304 via a contact hole (not shown).

The gate electrode 22 of PMOS transistor P2, NMOS transistor N2, PMOS transistor P1 and NMOS transistor N1 is connected to an input terminal. Also, the drain electrode 31 of PMOS transistor P1 and NMOS transistor N1 is connected to an output terminal, and the source electrode 32 of PMOS transistor P1 is connected to the drain electrode 310 of the PMOS transistor P2 by the wiring 85. In addition, the source electrode 309 of PMOS transistor P2 is connected to the power source voltage Vdd not shown, the source electrode 30 of NMOS transistor N1 is connected to the drain electrode 307 of NMOS transistor N2 by the wiring 86, and the source electrode 308 of the NMOS transistor N2 is connected to the power source voltage Vss (not shown).

In this inverter, 4 thin film transistors N1, N2, P1 and P2 are formed two by two on the single crystal grains having different plane orientations, respectively. That is, the thin film transistors N1 and P1 are formed on the single crystal grain 161 having the first plane orientation, and the thin film transistors N2 and P2 are formed on the single crystal grain 162 having the second plane orientation.

Herein, in case that the input in this CMOS circuit is conducted, the output path is N2-N1 or P2-P1. And, any of the paths will go by way of the thin film transistors formed in the single crystals having different plane orientations one by one. Therefore, since the CMOS circuit characteristic by plane orientation has a similar effect on both sides in any path, the effect caused by plane orientation is not biased to just one of output paths.

As a result, as in the above-mentioned first exemplary embodiment, the effect on reducing or preventing the characteristic deviation from occurring caused by the plane orientations of the channel regions may be obtained. Therefore, in using this inverter circuit, the malfunction caused by the differences of the plane orientations of the channel regions may be reduced or prevented so that a highly reliable inverter circuit having stable operation can be realized.

The thus constructed CMOS circuit can be made in the same way as in the above-mentioned first exemplary embodiment.

Third Exemplary Embodiment

Figure 16:
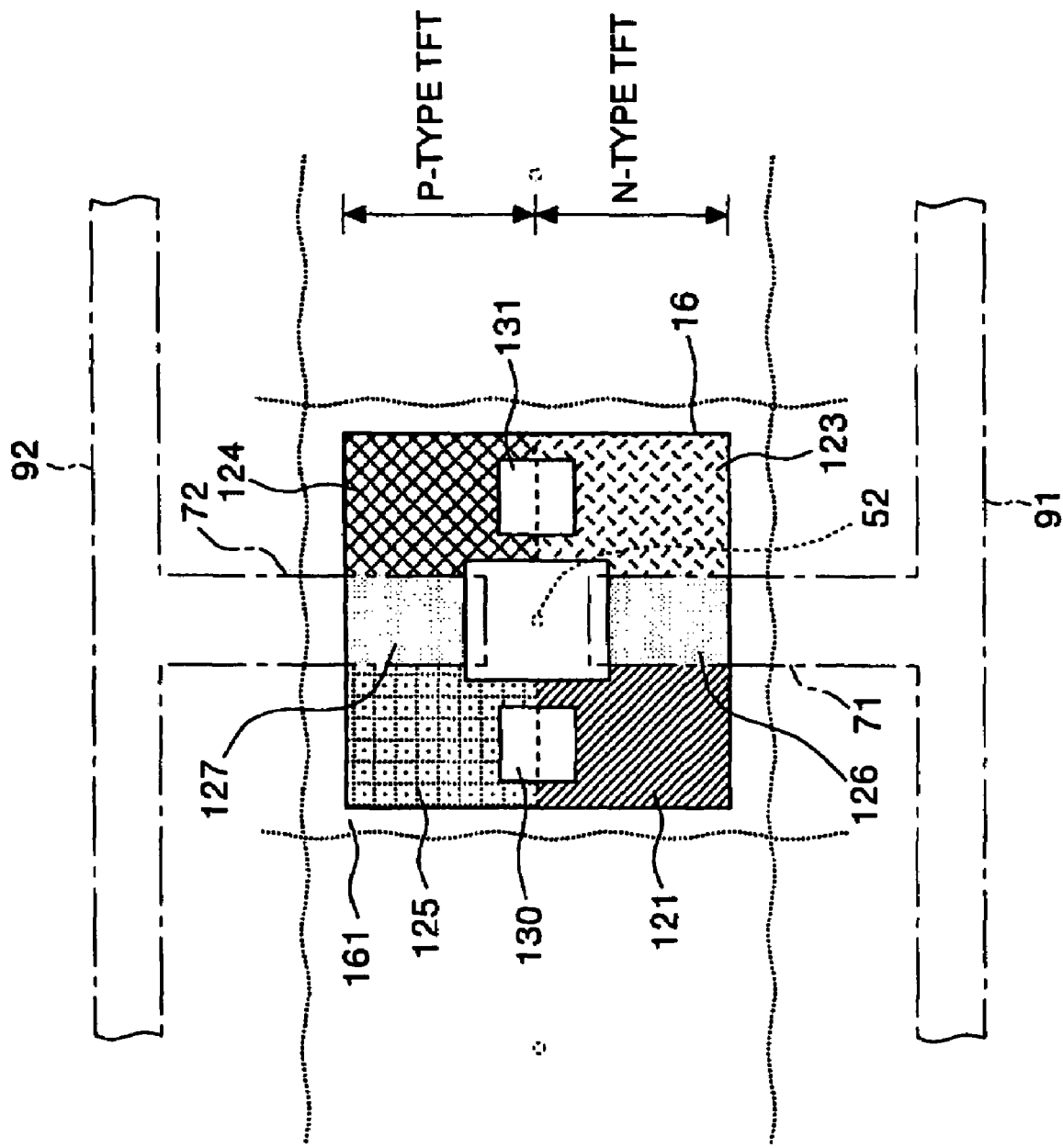
FIG. 16 is a plan view illustrating another CMOS circuit according to an aspect of the present invention.
Figure 17:
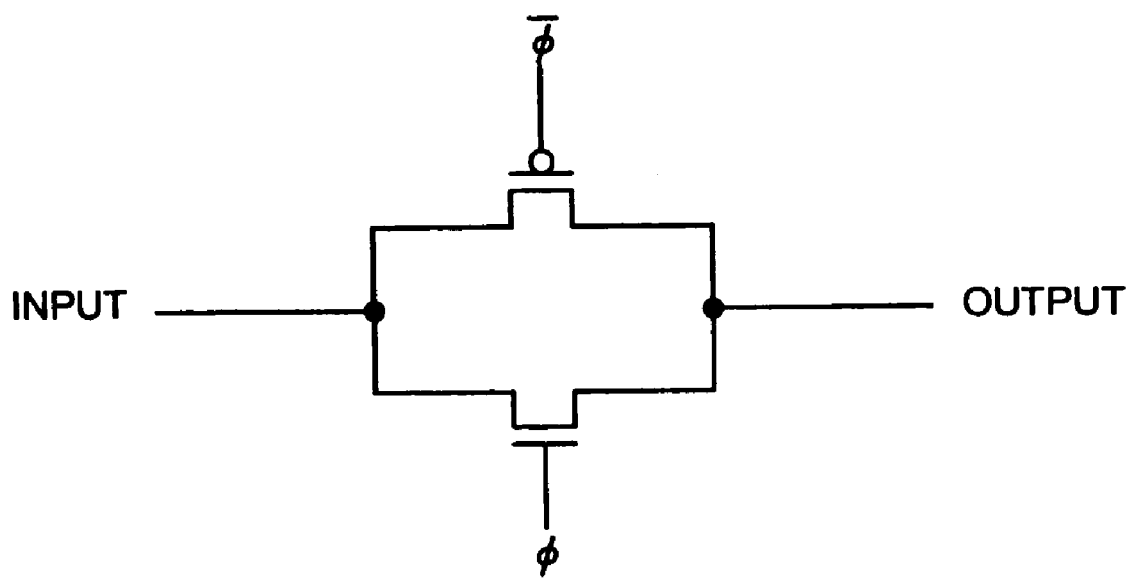
FIG. 17 is a circuit schematic of the CMOS circuit shown in FIG. 16.

FIGS. 16 and 17 illustrate the construction of a pass gate constructed by using the CMOS circuit, according to an aspect of the present invention, in which FIG. 16 is a plane view and FIG. 17 is a circuit schematic. Further, in FIG. 16, a gate electrode and transistor regions (a source region, a drain region, and a channel region) are primarily highlighted and other elements are omitted. Also, to assist the understanding, the same members as those of the above-mentioned exemplary embodiment are imparted with similar reference numerals.

The pass gate according to the present exemplary embodiment is constructed by forming two types of thin film transistors using single crystal grains formed by adopting the grain filters 52 formed on an insulating film, on a glass substrate as starting points upon crystallization of the semiconductor film, as in the first exemplary embodiment. That is, NMOS transistor and PMOS transistor are formed on the single crystal grain 161 so that the CMOS circuit may be constructed. And, as shown in FIG. 17, the complementary signals are inputted in the NMOS transistor and PMOS transistor in the CMOS circuit, and in case of one side being high, the other side is low.

The NMOS transistor is formed in one part of almost half of a substantially rectangular region (the half region of the lower side in FIG. 16) in the silicon film 16 patterned in a rectangular shape while avoiding the region including the grain filter 52 as shown in FIG. 16. The region of one end side of long direction of the substantially rectangular region (the half region of the left side in FIG. 16) becomes a high-density source region 121, and the region of the other end side (the half region of the right side in FIG. 16) becomes a high-density drain region 123. Further, the region sandwiched between the source region 121 and the drain region 123 is the channel region 126.

Also, in the upper side of the channel region 126, the gate electrode 71 of clock control is formed in the substantially perpendicular direction to the long, side of a substantially rectangle. The gate electrode 71 of clock control is connected to the clock line 91.

And, in the upper side of the source region 121, the source electrode 130 is formed, and the source electrode 130 is connected to the source region 121 via a contact hole (not shown). Also, in the upper side of the drain region 123, the drain electrode 131 is formed, and the drain electrode 131 is, connected to the drain region 123 via a contact hole (not shown). Herein, the source electrode 130 and the drain electrode 131 form common electrodes for NMOS transistor and PMOS transistor.

The PMOS transistor is formed in the other part of almost half of a substantially rectangular region (the half region of the upper side in FIG. 16) in the silicon film 16 patterned in a rectangular shape while avoiding the region including the grain filter 52 as shown in FIG. 16. The region of one end side of long direction of the substantially rectangular region (the half region of the right side in FIG. 16) becomes a high-density source region 125, and the region of the other end side (the half region of the left side in FIG. 16) becomes a high-density drain region 124. Further, the region sandwiched between the source region 125 and the drain region 124 is the channel region 127.

The gate electrode 72 for clock control is formed in the upper side of the substantially rectangular channel region 127 in a substantially perpendicular direction to a long side of the rectangle. The gate electrode 72 of clock control is connected to the clock line 92.

In the upper side of the source region 125, the source electrode 130 is formed, and the source electrode 130 is connected to the source region 125 via a contact hole (not shown). Also, in the upper side of the drain region 124, the drain electrode 131 is formed, and the drain electrode 131 is connected to the drain region 124 via a contact hole (not shown). As illustrated in detail, the source electrode 130 and the drain electrode 131 form common electrodes for NMOS transistor and PMOS transistor.

In the pass gate, the NMOS transistor and PMOS transistor constituting the CMOS circuit are all formed on one single crystal grain 161. Therefore, since the plane orientations of the channel regions of NMOS transistor and PMOS transistor constituting the CMOS circuit may be equalized in this pass gate, the aforementioned effect of an aspect of the present invention can be obtained. Therefore, by using this pass gate, the malfunction caused by the differences of the plane orientations of the channel regions may be reduced or prevented so that a stably operating and highly reliable pass gate may be realized.

Figure 18:
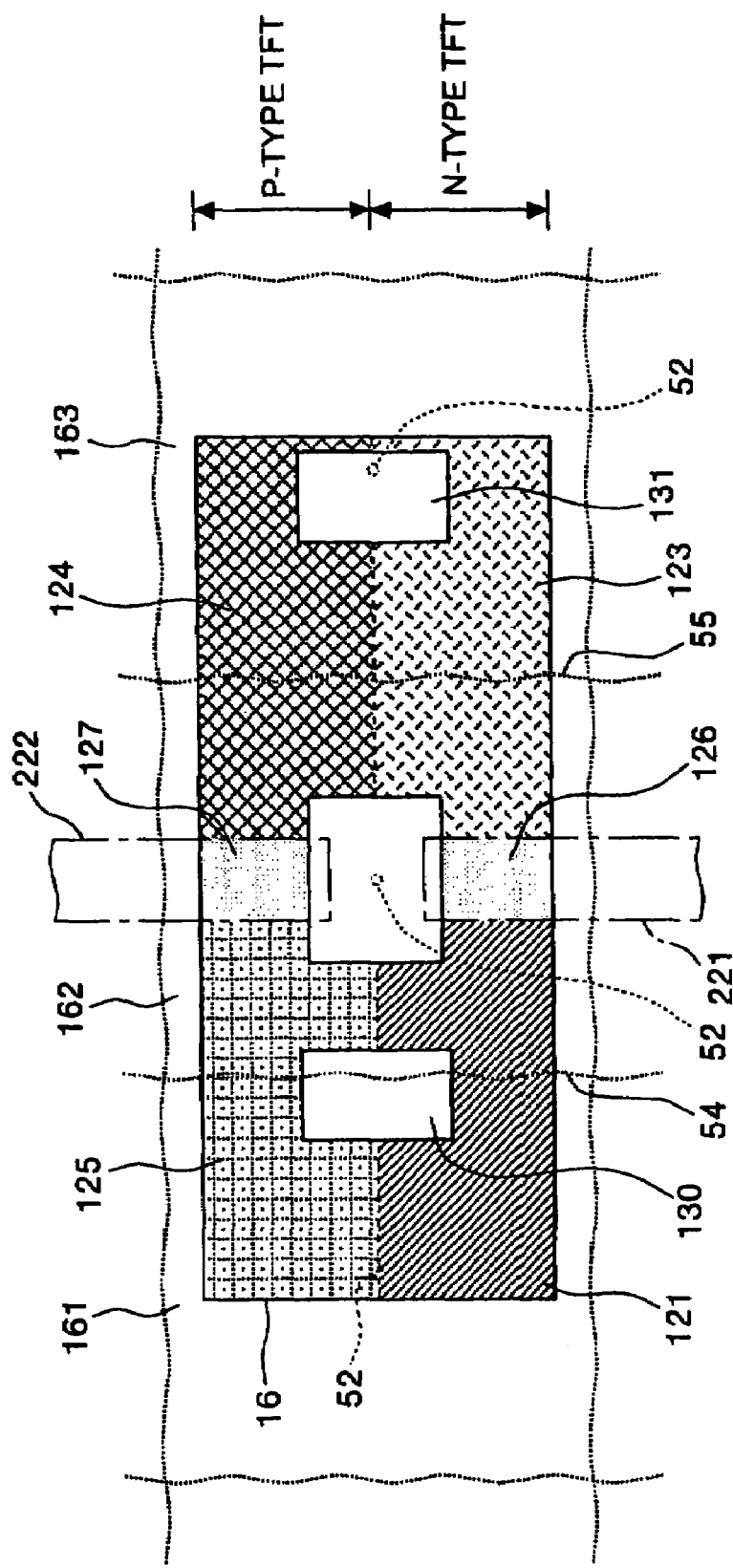
FIG. 18 is a plan view illustrating another CMOS circuit according to an aspect of the present invention.

Then, FIG. 18 illustrates a modified example of the pass gate shown in FIGS. 16 and 17. The pass gate in FIG. 18 is configured by enlarging the source region and drain region of the pass gate shown in FIGS. 16 and 17. The rectangular shaped silicon film 16 is formed in the wide region over the single crystal grain 161, 162 and 163. Also, the source region and drain region are the high-density source region and drain region, likewise the pass gate.

The source electrode 130 is formed on the crystal grain boundary 54 between the single crystal grain 161 and the single crystal grain 162, and the drain electrode 131 is formed on the grain filter 52 in the single crystal grain 163. Since the semiconductor film rises higher than any other regions, it is easy for the phase of the crystal grain boundary and the phase of the grain filter to come in contact with metals which become electrodes, and by this construction, it is easy for those phases to be in contact, from and surely with, the source region and the drain region.

In this pass gate, the NMOS transistor and PMOS transistor constituting the CMOS circuit are all formed in one single crystal grain 161. Therefore, since the plane orientations of the channel regions of NMOS transistor and PMOS transistor constituting the CMOS circuit may be equalized in this pass gate, the effect of an aspect of the present invention, likewise the pass gate illustrated above, can be obtained. Therefore, by using this pass gate, the malfunction caused by the differences of the plane orientations of the channel regions may be reduced or prevented so that a stably operating and highly reliable pass gate can be realized.

Fourth Exemplary Embodiment

Figure 19:
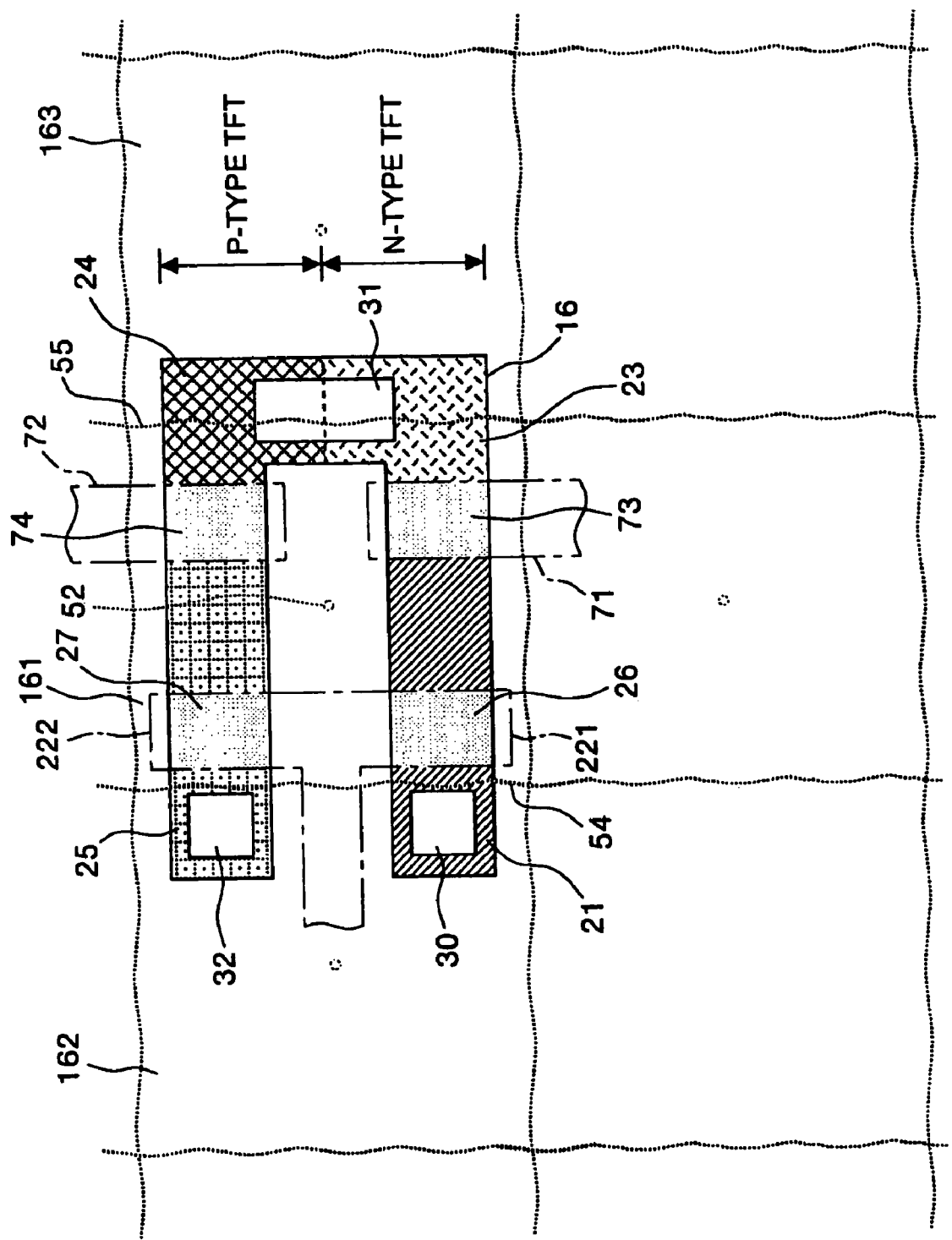
FIG. 19 is a plan view illustrating another CMOS circuit according to an aspect of the present invention.
Figure 20:
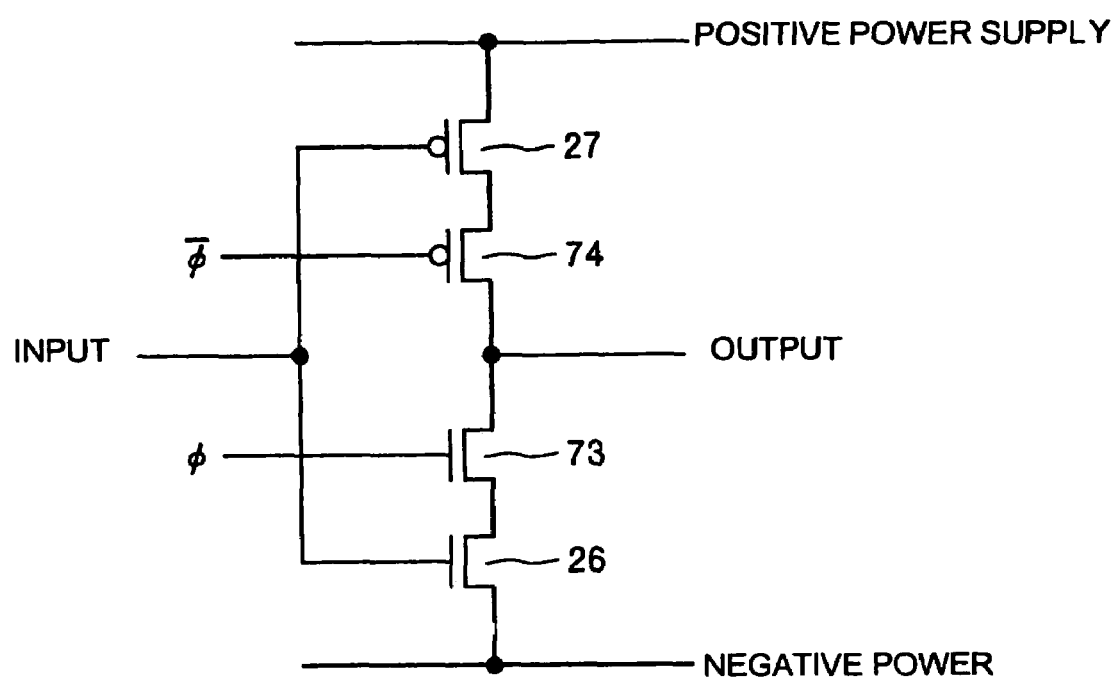
FIG. 20 is a circuit schematic of the CMOS circuit shown in FIG. 19.

FIGS. 19 and 20 illustrate the construction of a clocked inverter constructed by using the CMOS circuit, according to an aspect of the present invention, in which FIG. 19 is a plane view and FIG. 20 is a circuit schematic. Further, in FIG. 19, the gate electrode and the transistor regions (source region, drain region and channel region) are primarily highlighted, and other elements are omitted, as in the above case. Further, to assist the understanding, the same members as those of the above-mentioned exemplary embodiment are imparted with similar reference numerals.

Since the basic construction of the clocked inverter circuit shown in FIG. 19 is the same as that of the inverter circuit shown in FIG. 1, what are unlike FIG. 1 will be explained and the detailed description will be omitted.

In this clocked inverter, the gate electrodes 71 and 72 to control clock are installed in the region between the drain electrode 31 and the gate electrode 221 as the region within the single crystal grain 161 in the drain region 23 and in the region between the drain electrode 31 and the gate electrode 222 as the region within the single crystal grain 161 in the drain region 24 in the inverter in FIG. 1. And, the regions corresponding to the gate electrodes 71 and 72 to control clock in the U-shaped silicon film 16 are the channel regions 73 and 74, respectively. In addition, the gate electrodes 71 and 72 to control clock are connected to a clock line (not shown).

Also, the source region 21 and the source region 25 are formed from the single crystal grain 161 over the single crystal grain 162 adjacent to the single crystal grain 161. Also, the drain region 23 and the drain region 24 are formed from the single crystal grain 161 over the single crystal grain 163 adjacent to the single crystal grain 161.

The source electrodes 30 and 32 are formed in the region within the single crystal grain 162 in the source region 21 and the source region 25, respectively. Also, the drain electrode 31 is formed on the crystal grain boundary 55 between the single crystal grain 161 and the single crystal grain 162. Herein, since the semiconductor film rises higher than any other regions, it is easy for the phase of the crystal grain boundary to come in contact with a metal which becomes an electrode, and by this structure, it is easy for the phase to be in contact, from and surely with, the drain region.

In the clocked inverter, four channel regions 26, 27, 73 and 74 are all formed on one single crystal grain 161. Therefore, since in this clocked inverter all the plane orientations of four channel regions can be equalized, the above-mentioned effect of an aspect of the present invention can be obtained. Therefore, by using this clocked inverter, the malfunction caused by the differences of the plane orientations of the channel regions may be reduced or prevented so that a stably operating and highly reliable clocked inverter can be realized.

Fifth Exemplary Embodiment

Figure 21:
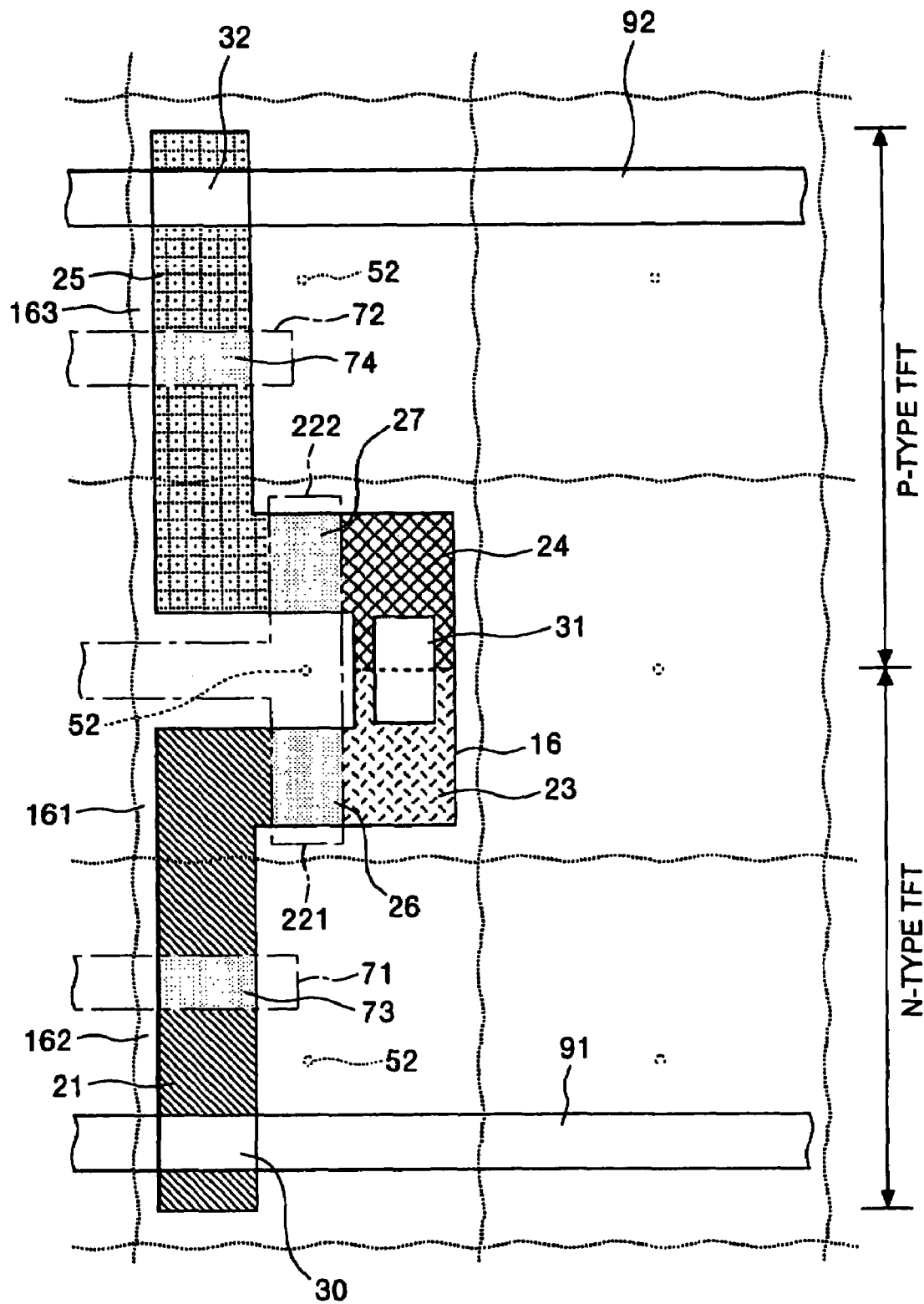
FIG. 21 is a plan view illustrating another CMOS circuit according to an aspect of the present invention.
Figure 22:
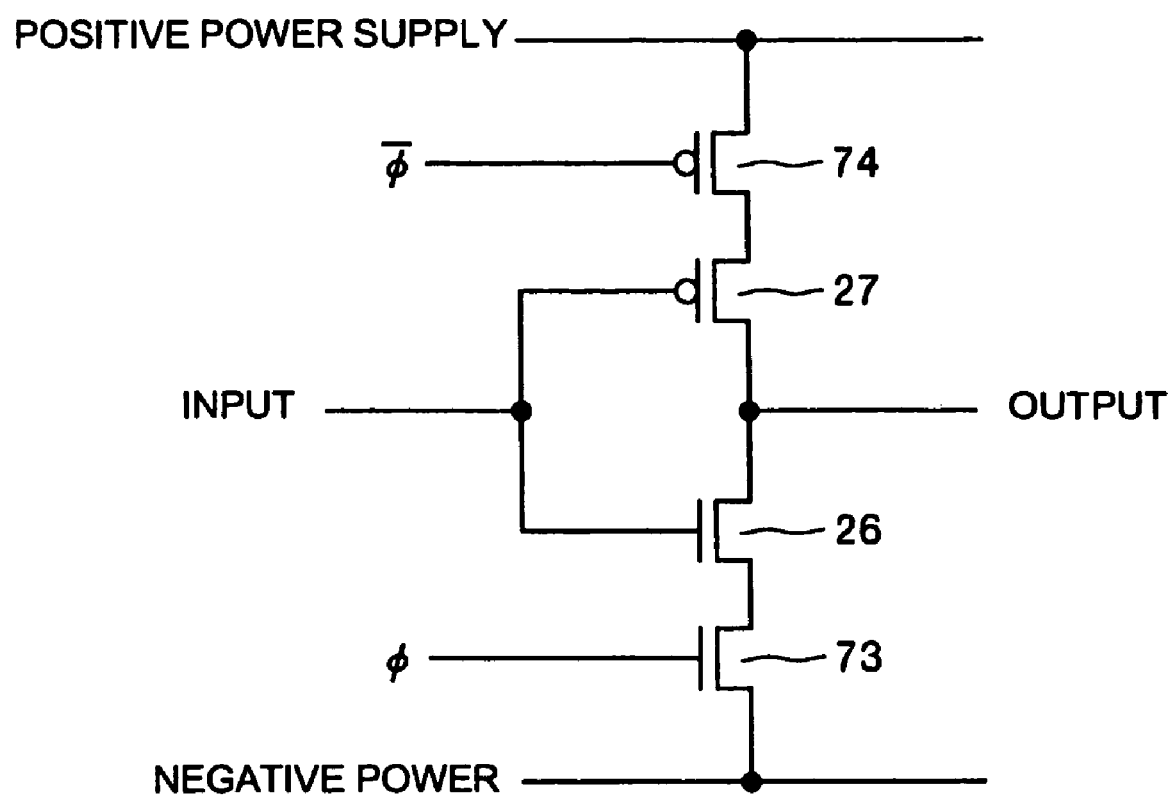
FIG. 22 is a circuit schematic of the CMOS circuit shown in FIG. 21.

FIG. 21 illustrates another construction example of a clocked inverter constructed by using the CMOS circuit, according to an aspect of the present invention. Further, in FIG. 21, the gate electrode and the transistor regions (source region, drain region and channel region) are primarily highlighted, and other elements are omitted, as in the above case. Further, to assist the understanding, the same member as those of the above-mentioned exemplary embodiment are imparted with similar reference numerals.

Since the clocked inverter circuit shown in FIG. 21 is a modified example of the inverter shown in FIG. 19, and the basic construction thereof is the same as that of the inverter in FIG. 19, just those features that are unlike FIG. 19 will be explained and the detailed description will be omitted.

In this clocked inverter, as shown in FIG. 21, the source region 21 is formed in a substantially L shape, which extends from the single crystal grain 161 over the single crystal grain 162 adjacent to the single crystal grain 161. Also, the source region 25 is formed in the L shape which extends from the single crystal grain 161 over the single crystal grain 163 adjacent to the single crystal grain 161. Herein, the single crystal grain 161 has the first plane orientation, and the single crystal grain 162 and the single crystal grain 163 have the second plane orientation unlike the first plane orientation.

The source electrodes 30 and 32 are installed in a substantially tip portion of the source region 21 on the single crystal grain 162 and a substantially tip portion of the source region 25 in the single crystal grain 163, respectively. The source electrodes 30 and 32 are connected to, the power source voltage Vss and the power source voltage Vdd, respectively.

Also, the gate electrodes 71 and 72 to control clock are installed in the region between the source electrode 30 and the gate electrode 221, and in the region between the source electrode 32 and the gate electrode 222. The gate electrodes 71 and 72 to control clock are connected to a clock line (not shown).

In the clocked inverter as configured above, in each of the NMOS transistor and the PMOS transistor, channel regions are formed one by one, in the single crystal grain 161 having the first plane orientation and the single crystal grain 162 or 163 having the second plane orientation, respectively. As a result, since in the NMOS transistor and the PMOS transistor the effect on the characteristic caused by the first plane orientation and the effect on the characteristic caused by the second plane orientation are almost the same, the effect caused by plane orientation is not biased to just one of transistors, so that the effect of reducing or preventing the production of characteristic deviation in the NMOS transistor and the PMOS transistor can be obtained. Therefore, by using the clocked inverter, the malfunction caused by the differences of the plane orientations of the channel regions may be prevented so that a stably operating and highly reliable clocked inverter can be realized.

Sixth Exemplary Embodiment

Figure 23:
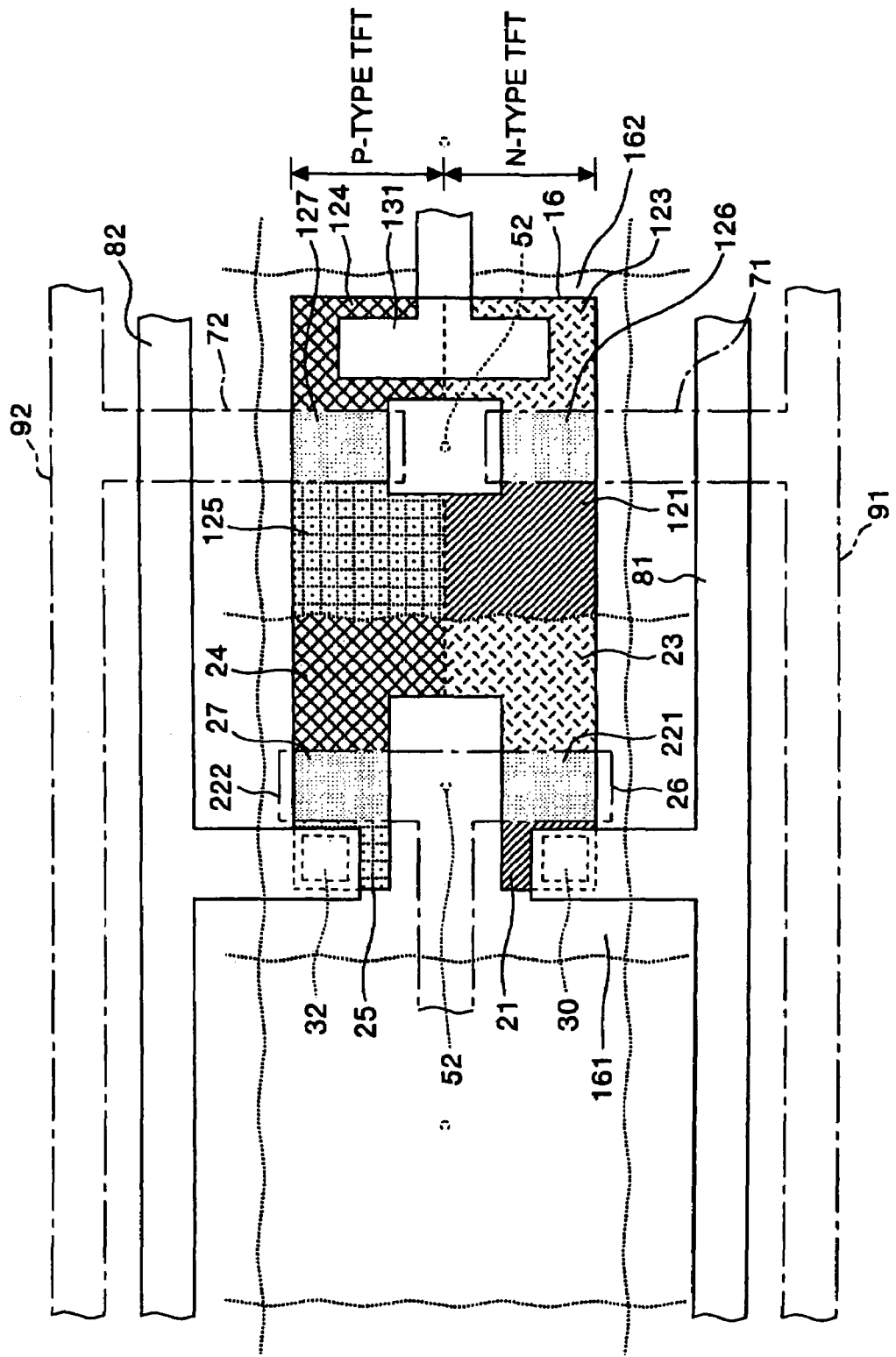
FIG. 23 is a plan view illustrating another CMOS circuit according to an aspect of the present invention.
Figure 24:
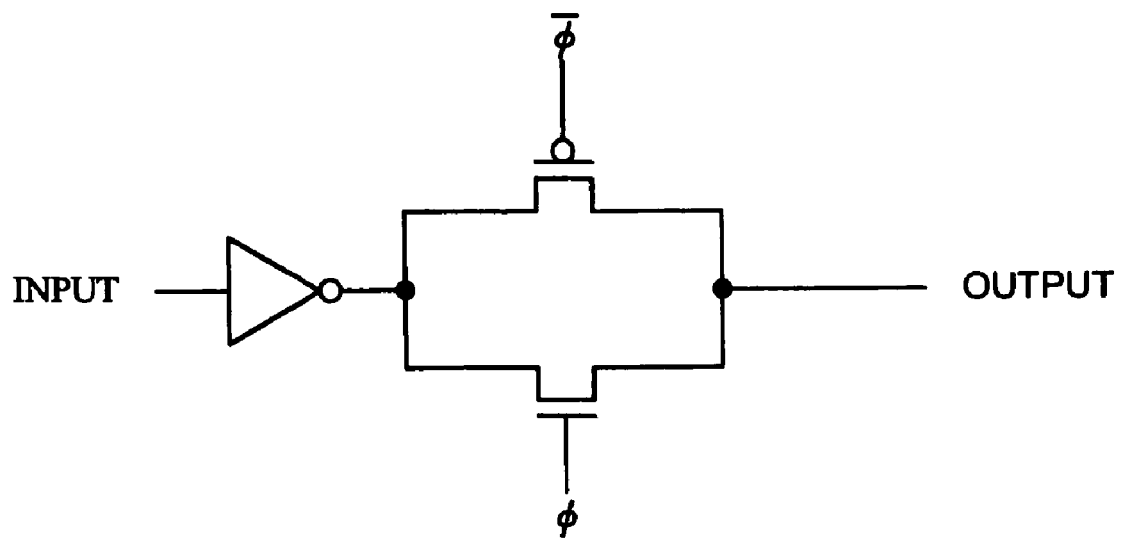
FIG. 24 is a circuit schematic of the CMOS circuit shown in FIG. 23.

FIGS. 23 and 24 illustrate other construction examples of a clocked inverter constructed by using the CMOS circuit, according to an aspect of the present invention, in which FIG. 23 is a plane view and FIG. 24 is a circuit schematic. Further, in FIG. 23, the gate electrode and the transistor regions (source region, drain region and channel region) are primarily highlighted, and other elements are omitted, as in the above case. Further, to assist in understanding, the same members as those of the above-mentioned first exemplary embodiment are imparted with similar reference numerals.

This clocked inverter is configured in combination with the inverter shown in FIG. 1 and the pass gate shown in FIG. 16. And, since the inverter shown in FIG. 1 and the pass gate shown in FIG. 16 all are constructed to have effects of an aspect of the present invention, the clocked inverter circuit of the present exemplary embodiment, constructed by the combination of the inverter and the pass gate, has the effects of the aspect of the present invention illustrated above, so that the characteristic deviation caused by the plane orientations may be reduced or prevented. Therefore, by using this clocked inverter, the malfunction caused by the differences of the plane orientations may be prevented so that a stably operating and highly reliable clocked inverter can be realized.

Seventh Exemplary Embodiment

Next, an example to which the CMOS circuit according to an aspect of the present invention is applied will be described. The CMOS circuit according to an aspect of the present invention can be used as, for example, a switching device of a liquid crystal display device or a driver device or the like, of an organic EL display device in the electro-optical device.

Figure 25:
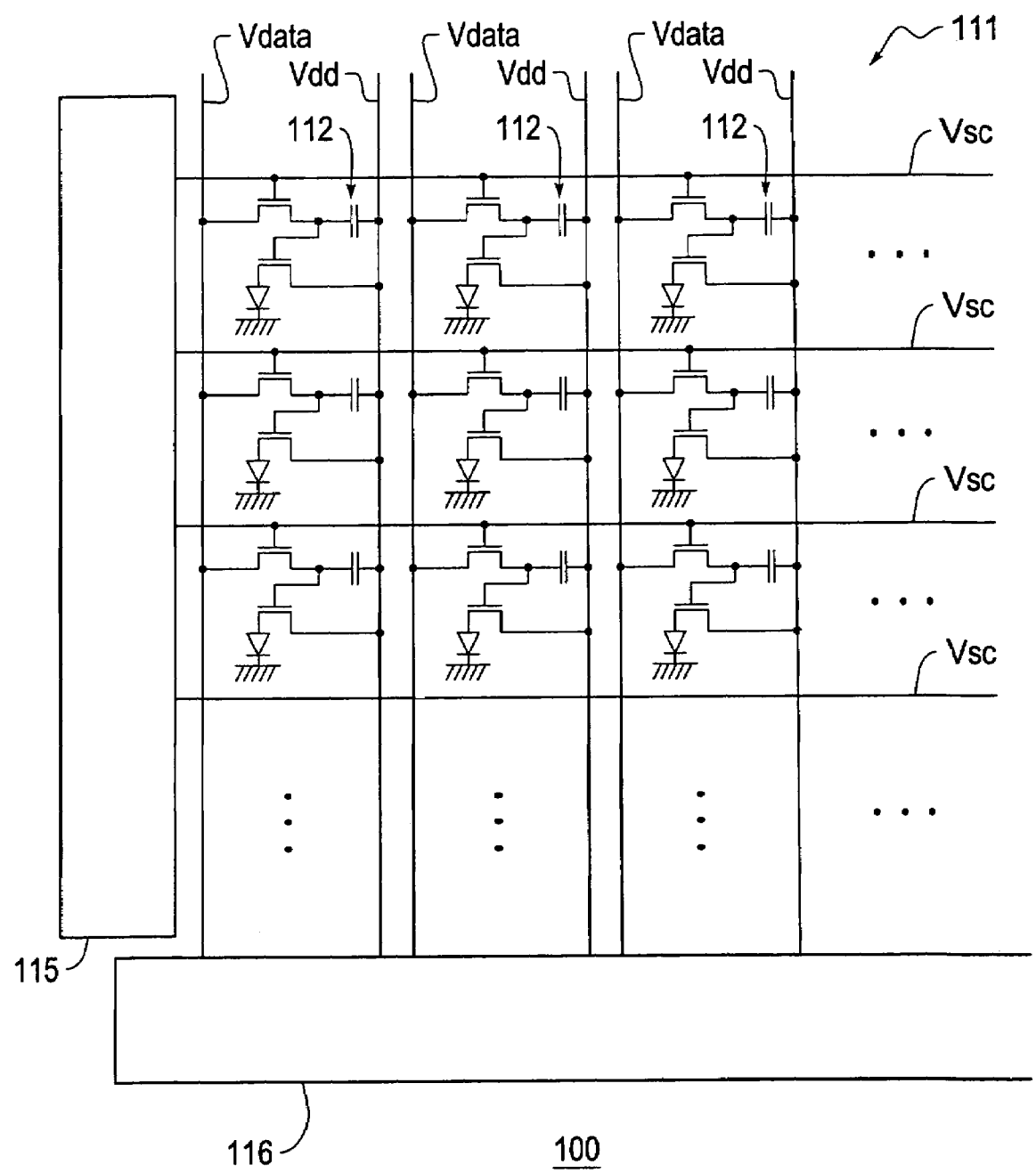
FIG. 25 is a construction schematic illustrating an example of an electro-optical device according to an aspect of the present invention.

FIG. 25 illustrates a connection state of a circuit of a display device 100, which is an example of an electro-optical device according to an aspect of the present invention. As shown in FIG. 25, the display device 100 is configured by arranging the pixel region 112 in the display region 111. The pixel region 112 uses a thin film transistor for driving the organic EL light-emitting device.

A scanning line (Vsc) is supplied from the driver region 115 to each pixel region 112. A data (Vdata) and a power (Vdd) are supplied from the driver region 116 to each pixel region 112. In this display device 100, the CMOS transistor according to an aspect of the present invention is used in the driver regions 115 and 116.

Further, the above-mentioned circuit is an example of the circuit in which the current light-emitting device is used in the light-emitting element and other circuit construction may be used. Further, in addition to the current light-emitting device, a liquid crystal display device may be used in the light-emitting element. In this case, the circuit structure may be changed corresponding to the liquid crystal display device.

Eighth Exemplary Embodiment

FIG. 26 illustrates a concrete example of the electronic apparatus to which the above-mentioned display device 100 can be applied, that is, an electronic apparatus to which the CMOS circuit according to an aspect of the present invention can be applied.

Figure 26A:
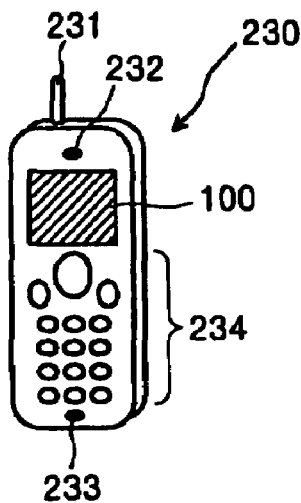
FIG. 26 illustrates an instance of an electronic apparatus according to an aspect of the present invention.

FIG. 26(A) is a portable telephone 230 in which the CMOS circuit according to an aspect of the present invention is mounted, in which the portable telephone 230 includes an electro-optical device (display panel) 100, an antenna portion 231, an audio output portion 232, an audio input portion 233, and an operation portion 234 and the like. In the portable telephone 230, the above-mentioned display device 100 can be used as a display panel and a CMOS circuit according to an aspect of the present invention can be applied to, for example, a display panel or embedded integrated circuit.

Figure 26B:
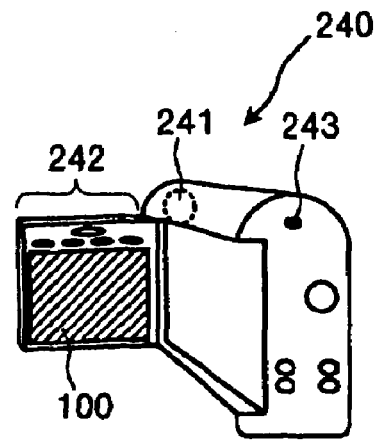

FIG. 26(B) is a video camera 240 in which the CMOS circuit according to an aspect of the present invention is mounted, and the video camera 240 includes an electro-optical device (display panel) 100, an image receiving portion 241, an operation portion 242, an audio input portion 243 and the like. In the video camera 240, the above-mentioned display device 100 may be used as a display panel and a CMOS circuit according to an aspect of the present invention can be applied to, for example, a display panel or an embedded integrated circuit.

Figure 26C:
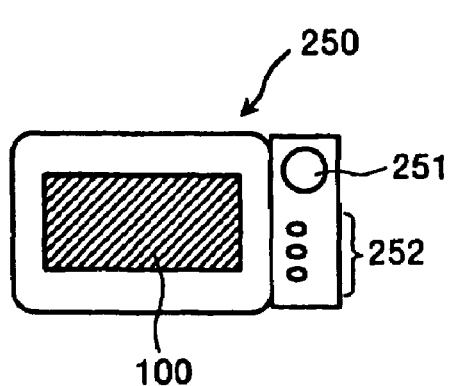

FIG. 26(C) is a portable personal computer 250 in which the CMOS circuit according to an aspect of the present invention is mounted, the portable personal computer 250 including an electro-optical device (display panel) 100, a camera unit 251, an operation portion 252 and the like. In the portable personal computer 250, the above-mentioned display device 100 can be used as a display panel and the CMOS circuit according to an aspect of the present invention can be applied to, for example, a display panel or an embedded integrated circuit.

Figure 26D:
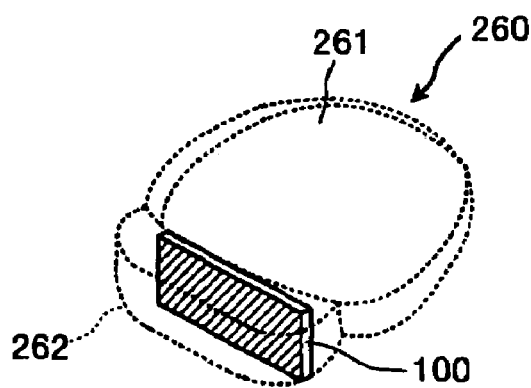

FIG. 26(D) is a head mount display 260 in which a CMOS circuit according to an aspect of the present invention is mounted, wherein the head mount display 260 including an electro-optical device (display panel) 100, a band unit 261, an optical system receiving unit 262 and the like. In the head mount display 260, the above-mentioned display device 100 can be used as a display panel and the CMOS circuit according to an aspect of the present invention can be applied to, for example, a display panel or an embedded integrated circuit.

Figure 26E:
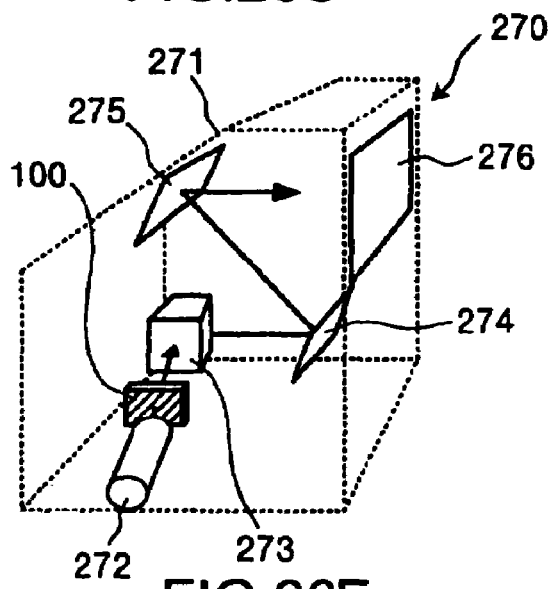

FIG. 26(E) is a rear type projector 270 in which a thin film transistor according to an aspect of the present invention is mounted, the rear type projector 270 including an electro-optical device (light modulator) 100, a light source 272, an optical system 273, a mirror 274, a mirror 275, a screen 276 and the like, in a case 271. In the rear type projector 270, the above-mentioned display device 100 can be used as the light modulator and the CMOS circuit according to an aspect of the present invention can be applied to, for example, a light modulator or an embedded integrated circuit.

Figure 26F:
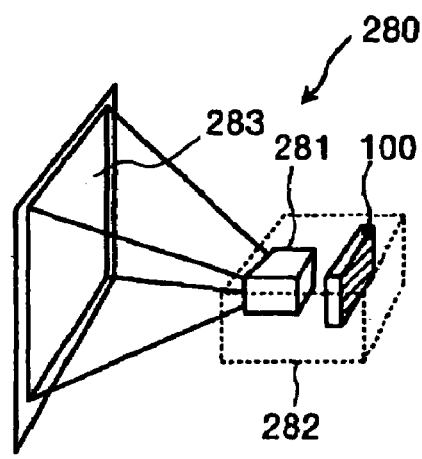

FIG. 26(F) is a front type projector 280 in which a CMOS circuit according to an aspect of the present invention is mounted, wherein the front type projector 280 including an electro-optical device (image display source) 100, an optical system 281, and the like in a case 282, and is adapted to display an image on the screen 283. In the front type projector 280, the above-mentioned display device 100 can be used as the image display source, and the CMOS circuit according to an aspect of the present invention can be applied to, for example, the image display source or an embedded integrated circuit.

Further, a CMOS circuit according to an aspect of the present invention is not limited to the present electronic apparatus and can be applied to all electronic apparatuses. For example, in addition to the above-mentioned device, the present invention can be applied to the manufacture of a wrist watch, an IC card, a facsimile apparatus having a display function, a finder of a digital camera, a portable TV, a DSP device, a PDA, an electronic diary, an electro-optical guest board, advertisement display or the like, and a high quality of an electronic apparatus can be realized.

Further, an aspect of the present invention includes the CMOS circuit including a NMOS transistor and a PMOS transistor, and if it is a circuit including a construction in which an output from the NMOS transistor and an output from the PMOS transistor are interconnected, comprehensive application thereof is available.

What is claimed is:

1. A complementary thin film transistor circuit, comprising:
   a substrate;
   a first thin film transistor that is formed on the substrate, the first thin film transistor including a first semiconductor film, a first gate electrode, and a first gate insulating film disposed between the first semiconductor film and the first gate electrode, the first semiconductor film including a first source region, a first drain region and a first channel region, the first thin film transistor being a first-conductivity-type thin film transistor; and
   a second thin film transistor that is formed on the substrate, the second thin film transistor including a second semiconductor film, a second gate electrode, a second gate insulating film disposed between the second semiconductor film and the second gate electrode, the second semiconductor film including a second source region, a second drain region, and a second channel region, the second thin film transistor being a second-conductivity-type thin film transistor, the first drain region and the second drain region being in contact with each other, and the first source region and the second source region being in contact with each other, the first channel region and the second channel region being formed in a same crystal grain.

2. A complementary thin film transistor circuit, comprising:
   a substrate;
   a first thin film transistor that is formed on the substrate, the first thin film transistor including a first semiconductor film, a first gate electrode, and a first gate insulating film disposed between the first semiconductor film and the first gate electrode, and the first semiconductor film including a first source region, a first drain region, and a first channel region;
   a second thin film transistor that is formed on the substrate, the second thin film transistor including a second semiconductor film, a second gate electrode, a second gate insulating film disposed between the second semiconductor film and the second gate electrode, the second semiconductor film including a second source region, a second drain region and a second channel region, the first drain region and the second drain region being in contact with each other and the first source region being separated from the second source region, the first channel region and the second channel region being formed in a same crystal grain;
   a first source electrode that is electrically contacting the first source region;
   a second source electrode that is electrically contacting the second source region; and
   a drain electrode that is electrically contacting the first drain region and the second drain region.

3. The complementary thin film transistor circuit according to claim 2, further comprising:
   a plurality of crystal grains formed on the substrate, each of the plurality of crystal grains being a single crystal grain, one of the plurality of crystal grains including the first semiconductor film and the second semiconductor film.

4. The complementary thin film transistor circuit according to claim 2, wherein the first channel region and the second channel region have a same plane orientation.

5. The complementary thin film transistor circuit according to claim 2, wherein the first thin film transistor is a first-conductivity-type thin film transistor and the second thin film transistor is a second-conductivity-type thin film transistor.

6. An electro-optical device, comprising:
   the complementary thin film transistor circuit according to claim 2.

7. A complementary thin film transistor circuit, comprising:
   a substrate;
   a first thin film transistor that is formed on the substrate, the first thin film transistor including a first semiconductor film, a first gate electrode, and a first gate insulating film disposed between the first semiconductor film and the first gate electrode, and the first semiconductor film including a first source region, a first drain region, and a first channel region, the first thin film transistor has an electric field relief region between the first source region and the first channel region; and
   a second thin film transistor that is formed on the substrate, the second thin film transistor including a second semiconductor film, a second gate electrode, a second gate insulating film disposed between the second semiconductor film and the second gate electrode, the second semiconductor film including a second source region, a second drain region and a second channel region, the first drain region and the second drain region being in contact with each other and the first source region being separated from the second source region, the first channel region and the second channel region being formed in a same crystal grain.

8. A complementary thin film transistor circuit, comprising:
   a substrate;
   a first thin film transistor that is formed on the substrate, the first thin film transistor including a first semiconductor film, a first gate electrode, and a first gate insulating film disposed between the first semiconductor film and the first gate electrode, and the first semiconductor film including a first source region, a first drain region, and a first channel region;
   a second thin film transistor that is formed on the substrate, the second thin film transistor including a second semiconductor film, a second gate electrode, a second gate insulating film disposed between the second semiconductor film and the second gate electrode, the second semiconductor film including a second source region, a second drain region and a second channel region, the first drain region and the second drain region being in contact with each other and the first source region being separated from the second source region, the first channel region and the second channel region being formed in a same crystal grain; and
   an insulating film on the substrate, the first thin film transistor and the second thin film transistor being formed on the insulating film, the insulating film having a concave portion.

* * * * *